US011056449B2

(12) United States Patent
Then et al.

(10) Patent No.: US 11,056,449 B2
(45) Date of Patent: Jul. 6, 2021

(54) GUARD RING STRUCTURES AND THEIR METHODS OF FABRICATION

(71) Applicant: Intel Corporation, Santa Clara, CA (US)

(72) Inventors: Han Wui Then, Portland, OR (US); Marko Radosavljevic, Portland, OR (US); Sansaptak Dasgupta, Hillsboro, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/462,726

(22) PCT Filed: Dec. 30, 2016

(86) PCT No.: PCT/US2016/069470
§ 371 (c)(1),
(2) Date: May 21, 2019

(87) PCT Pub. No.: WO2018/125203
PCT Pub. Date: Jul. 5, 2018

(65) Prior Publication Data
US 2019/0371743 A1    Dec. 5, 2019

(51) Int. Cl.
*H01L 23/48*     (2006.01)
*H01L 23/58*     (2006.01)
(Continued)

(52) U.S. Cl.
CPC ........ *H01L 23/585* (2013.01); *H01L 21/0254* (2013.01); *H01L 21/02576* (2013.01); *H01L 29/2003* (2013.01)

(58) Field of Classification Search
USPC ......................................................... 257/688
See application file for complete search history.

(56) References Cited

U.S. PATENT DOCUMENTS

2001/0038138 A1* 11/2001 Miles .................... H01L 23/585
257/544
2010/0012950 A1    1/2010 Liu et al.
(Continued)

FOREIGN PATENT DOCUMENTS

KR       10-0798275      1/2008
WO       WO-2015-129131  9/2015

OTHER PUBLICATIONS

International Search Report and Written Opinion for International Patent Application No. PCT/US2016/069470, dated Jul. 11, 2019, 10 pages.
(Continued)

*Primary Examiner* — Theresa T Doan
(74) *Attorney, Agent, or Firm* — Schwabe, Williamson & Wyatt, P.C.

(57) ABSTRACT

A guard ring structure includes a ring of semiconductor material disposed on a substrate. A conductive ring is disposed on the ring of semiconductor material. The conductive ring is interconnected by intervening vias. The guard ring structure may include a plurality of individual rings of the semiconductor material formed concentrically and in close proximity to one another on the substrate. A Guard ring structure is generally disposed around a periphery of a die containing integrated circuits that include transistors RF amplifiers and memory devices to reduce the impact of stresses arising from die sawing to separate individual die in a wafer.

25 Claims, 15 Drawing Sheets

(51) Int. Cl.
    *H01L 21/02*     (2006.01)
    *H01L 29/20*     (2006.01)

(56) References Cited

U.S. PATENT DOCUMENTS

| | | | |
|---|---|---|---|
| 2011/0260254 A1* | 10/2011 | Kim | H01L 27/0277 |
| | | | 257/355 |
| 2014/0328742 A1 | 11/2014 | Mori et al. | |
| 2015/0255351 A1* | 9/2015 | Hu | H01L 29/0619 |
| | | | 438/283 |
| 2017/0092485 A1* | 3/2017 | Brueck | H01L 21/0251 |
| 2017/0179222 A1 | 6/2017 | Handa et al. | |

OTHER PUBLICATIONS

International Search Report and Written Opinion for International Patent Application No. PCT/US2016/069470 dated Sep. 26, 2017, 11 pgs.

* cited by examiner

US 11,056,449 B2

GUARD RING STRUCTURES AND THEIR METHODS OF FABRICATION

CROSS-REFERENCE TO RELATED APPLICATION

This patent application is a U.S. National Phase Application under 35 U.S.C. § 371 of International Application No. PCT/US2016/069470, filed Dec. 30, 2016, entitled "GUARD RING STRUCTURES AND THEIR METHODS OF FABRICATION," which designates the United States of America, the entire disclosure of which is hereby incorporated by reference in its entirety and for all purposes.

TECHNICAL FIELD

Embodiments of the present invention generally relate to microelectronic devices and their methods of fabrication, and more particularly to integration of a group III-Nitride (group III-N) guard ring structure on silicon and design.

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more diodes in conjunction with one or more transistors, such as one or more field-effect transistors (FETs). Due, in part, to their large bandgap and high mobility, gallium nitride (GaN) and other group III-N semiconductor materials are suited for integrated circuits for applications such as high-frequency and high-power, but present challenges arising from damage during the manufacturing process. Reliable manufacturing processes that produce such integrated circuits may require some form of electrical and mechanical protection to prevent component damage. One form of mechanical and electrical protection can be obtained by fabrication of a guard ring structure around sensitive circuits.

BRIEF DESCRIPTION OF THE DRAWINGS

FIG. 3A illustrates a patterned insulator layer having a plurality of ring openings formed above a substrate.

FIG. 3B illustrates the structure of FIG. 3A, following the formation of a group III-N semiconductor material on the substrate in each of the plurality of ring openings.

FIG. 3C illustrates the structure of FIG. 3B, following the deposition of an interlayer dielectric (ILD) film on the group III-N semiconductor material and on the insulator layer.

FIG. 3D illustrates the structure of FIG. 3C, following a process to planarize the ILD and uppermost portions of the group III-N semiconductor material formed in the plurality of ring openings.

FIG. 3E illustrates the structure of FIG. 3D following the formation of a contact group III-N semiconductor material on the group III-N semiconductor material.

FIG. 3F illustrates the structure of FIG. 3E, following the deposition of a second ILD film on the contact group III-N semiconductor material.

FIG. 3G illustrates the structure of FIG. 3F, following a process to planarize the second ILD film and portions of the contact group III-N semiconductor material.

FIG. 3H illustrates the structure of FIG. 3G, following a process to form conductive interconnects on the contact group III-N semiconductor material.

FIG. 4A illustrates the structure of FIG. 3A, following the formation of a group III-N semiconductor material in the plurality of ring openings.

FIG. 4B illustrates the structure of FIG. 4A, following the deposition of an interlayer dielectric (ILD) film on the group III-N semiconductor material and on the insulator layer, followed by a planarization process.

FIG. 4C illustrates the structure of FIG. 4B following the formation of a contact group III-N semiconductor material on the group III-N semiconductor material and the formation of a second ILD film adjacent to sidewalls of the contact group III-N semiconductor material.

FIG. 4D illustrates the structure of FIG. 4C, following the formation of conductive interconnects on the contact group III-N semiconductor material.

FIG. 5A illustrates the structure of FIG. 3A, following the formation of a group III-N semiconductor material on the substrate, in the plurality of ring openings.

FIG. 5B illustrates the structure of FIG. 5A, following the deposition of an ILD film on the group III-N semiconductor material and on the insulator layer, followed by a planarization process.

FIG. 5C illustrates the structure of FIG. 5B following the formation of a contact group III-N semiconductor material on the group III-N semiconductor material formed.

FIG. 5D illustrates the structure of FIG. 5C, following the formation of conductive interconnects on the contact group III-N semiconductor material.

DESCRIPTION OF THE EMBODIMENTS

Figure 1:
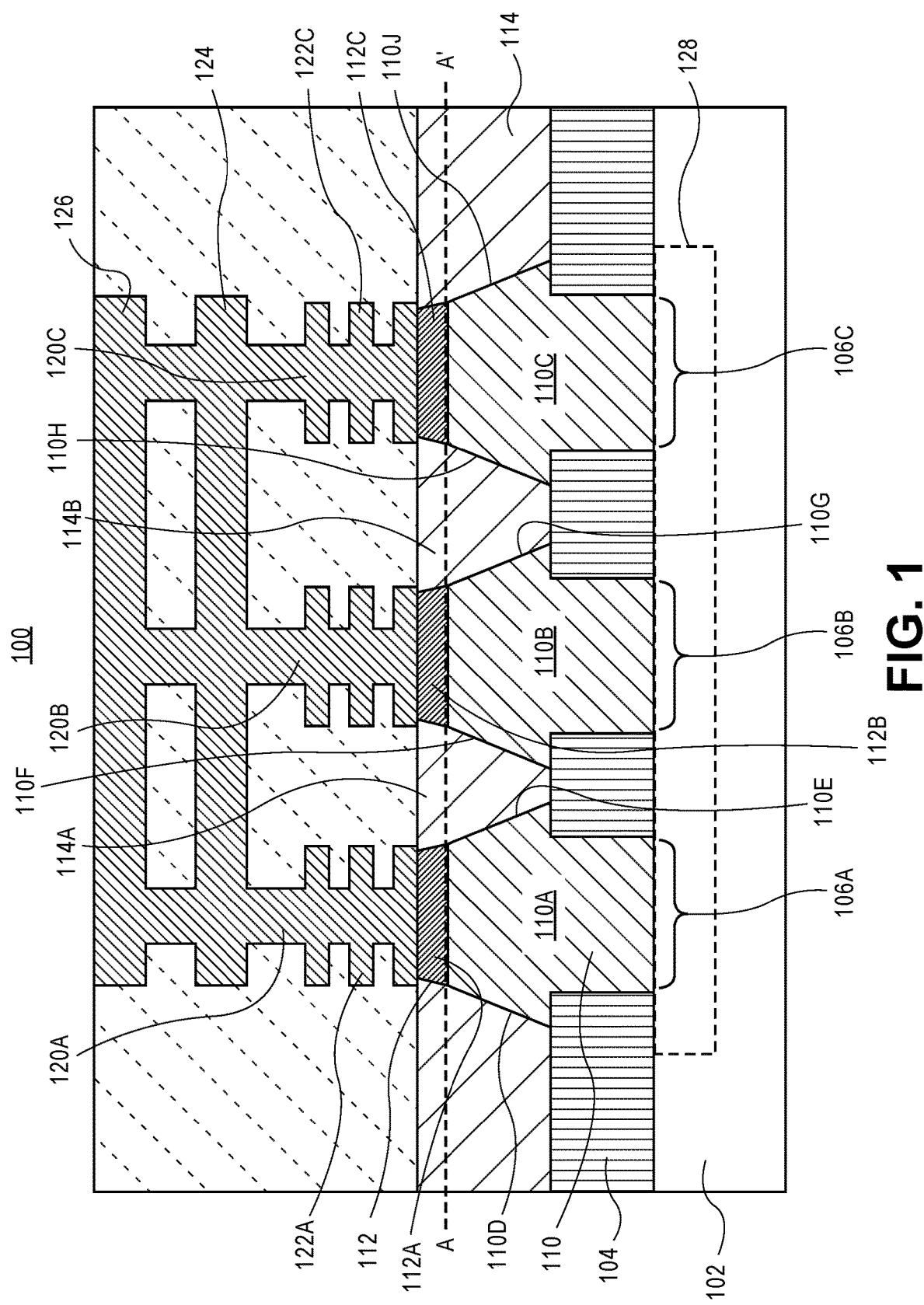
FIG. 1 illustrates a cross-sectional view of a guard ring structure disposed above a substrate.

Guard ring structures for logic, system-on-chip (SoC), radio frequency (RF) components and memory applications and their methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as electrical interaction between the substrate and the guard ring, are described in lesser detail in order to not unnecessarily obscure embodiments of the present invention. Furthermore, it is to be understood that the various embodiments shown in the Figures are illustrative representations and are not necessarily drawn to scale.

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Guard ring structures are used in RF front end circuits to provide protection to circuit components as transistors, RF filters, RF power amplifiers and RF low noise amplifiers against propagation of die-saw stress and contaminants. While traditional guard ring structures can be manufactured using conventional silicon, guard rings fabricated from group III-N semiconductor materials may offer mechanical advantages that far outweigh those provided by a semiconductor material such as silicon. Additionally, integration schemes that can fabricate guard ring structures including group III-N semiconductor material alongside with devices including group III-N semiconductor material are highly desirable. If such schemes can be carried out by minimizing additional process steps between the formation of guard ring structures and device structures, cost advantages may also be realized.

An embodiment of the present invention is a guard ring structure disposed on a substrate. In an embodiment, guard ring structure includes a ring of semiconductor material disposed on the substrate. In an embodiment, the semiconductor material includes a material that is different from the substrate. In an embodiment a conductive ring is disposed on the ring of semiconductor material. In an embodiment, the conductive ring is interconnected by intervening vias. In a further embodiment, the guard ring structure includes a plurality of individual rings of the semiconductor material formed concentrically and in close proximity to one another on the substrate. In one such embodiment, the conductive ring includes a plurality of interconnect structures disposed above each of the plurality of rings of semiconductor material. In an embodiment, the guard ring structure is disposed around a periphery of a die containing integrated circuits that include transistors RF amplifiers and memory devices. In other embodiments, a smaller guard ring structure surrounds a smaller collection of devices that are electrically coupled together within a portion of die.

In an embodiment, the guard ring structure is formed from a group III-N semiconductor material. The group III-N semiconductor material offers potential advantages as a guard ring structure over conventional interconnect only based guard ring. The group III-N semiconductor material has a high bond strength that results in a greater mechanical strength. The mechanical strength of the group III-N semiconductor material is particularly desirable to prevent die stress fractures from propagating into the vicinity of sensitive integrated devices in the die. during die-sawing of a substrate to fabricate microprocessor chips.

FIG. 1 illustrates a cross-sectional view of a guard ring structure 100 disposed above a substrate 102, in accordance with an embodiment of the present invention. The guard ring structure 100 includes a patterned insulator layer 104 having at least one ring opening, and in general a plurality of ring openings disposed on the substrate 102. The patterned insulator layer illustrated in FIG. 1, for example has three such ring openings 106A, 106B and 106C. In an embodiment, a group III-N semiconductor material 110, having portions 110A, 110B and 110C is disposed in each of the plurality of ring openings 106A, 106B and 106C, respectively, on the substrate 102. The group III-N semiconductor material 110A, 110B and 110C form concentric rings around a periphery of a die 200, as is depicted in the plan view illustration of FIG. 2A.

Referring again to FIG. 1, the group III-N semiconductor material 110A extends onto a portion of the patterned insulator layer 104 and has a pair of sloped sidewalls 110A and 110B and an uppermost surface 110C. The group III-N semiconductor material 110B extends onto a portion of the patterned insulator layer 104 and has a pair of sloped sidewalls 110D and 110E and an uppermost surface 110F. The group III-N semiconductor material 110C onto a portion of the patterned insulator layer 104 and has a pair of sloped sidewalls 110G, 110H and an uppermost surface 110J. In an embodiment, a contact group III-N semiconductor material 112, having portions 112A, 112B and 112C is disposed on the uppermost surfaces, 110C, 110F and 110J of the group III-N semiconductor material 110A, 110B and 110C, respectively. The contact group III-N semiconductor material 112 helps to reduce the overall electrical resistance of the guard ring structure.

An interlayer dielectric (ILD) film 114 is disposed on the patterned insulator layer 104. A portion 114A of the ILD film 114 is disposed on a portion of the patterned insulator layer 104 and between the sloped sidewalls 110B and 110D of the group III-N semiconductor material 110A and 110B, respectively. A portion 114B of the ILD film 114 is disposed on portion of the patterned insulator layer 104 and between the sloped sidewalls 110F and 110G of the group III-N semiconductor material 110B and 110C, respectively. ILD 114A is also disposed between the sidewalls of the contact group III-N semiconductor material 112A and 112B and ILD 114B is also disposed between the sidewalls of the contact group III-N semiconductor material 112B and 112C. A plurality of conductive interconnects 120A, 120B and 120C are disposed on and electrically coupled to the contact group III-N semiconductor material 112A, 112B and 112C, respectively.

In an embodiment, a conductive interconnect structure 120 is disposed on the contact group III-N semiconductor material 112. The conductive interconnect structure 120 includes conductive interconnects 120A, 120B and 120C that are disposed on the uppermost surface 112A, 112B and 112C of the contact group III-N semiconductor material 112, respectively. In an embodiment, the each conductive interconnect 120A, 120B and 120C includes one or more metal rings interconnected by intervening vias. The metal ring or rings run parallel to the ring of group III-N semiconductor material 110. In an exemplary embodiment, each conductive interconnect 120A, 120B and 120C in the guard ring structure 100 includes a ring 122A, 122B and 122C, respectively and illustrated in FIG. 1. In an embodiment, each of the conductive interconnects 120A, 120B and 120C are electrically coupled by lateral conductive bridges 124 and 126 as is depicted in FIG. 1. In an embodiment, the lateral conductive bridges 124 and 126 do not form rings but connect the conductive interconnects 120A, 120B and 120C at certain fixed locations (dashed lines 216) as is illustrated in the plan view FIG. 2.

Figure 4A:
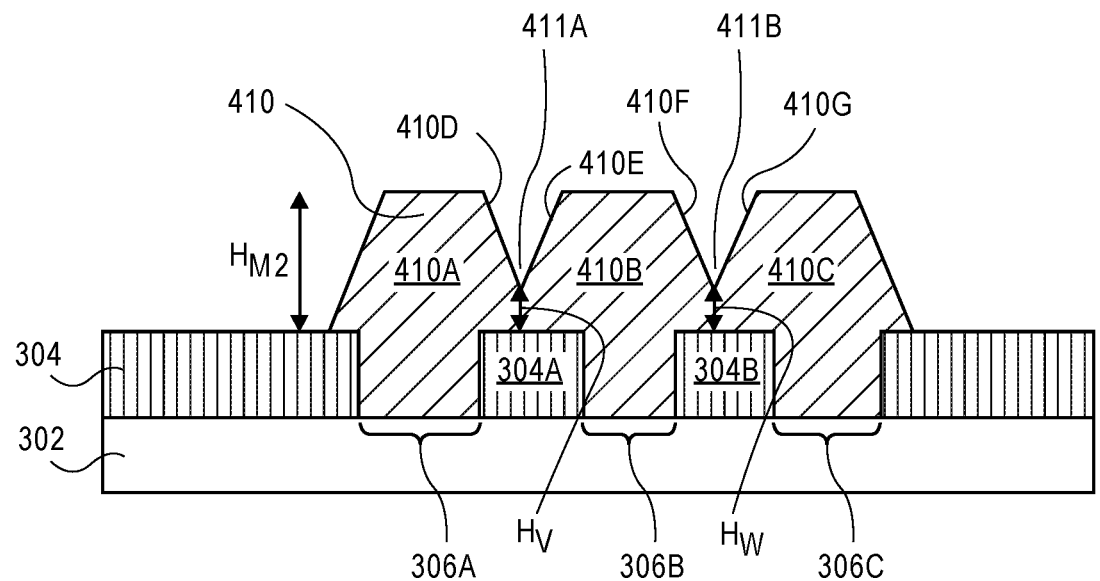
FIGS. 4A-4D illustrate cross-sectional views representing various operations in a method of fabricating a guard ring structure, where adjacent sidewalls of the group III-N semiconductor disposed in the plurality of ring openings are partially merged, in accordance with embodiments of the present invention.
Figure 5A:
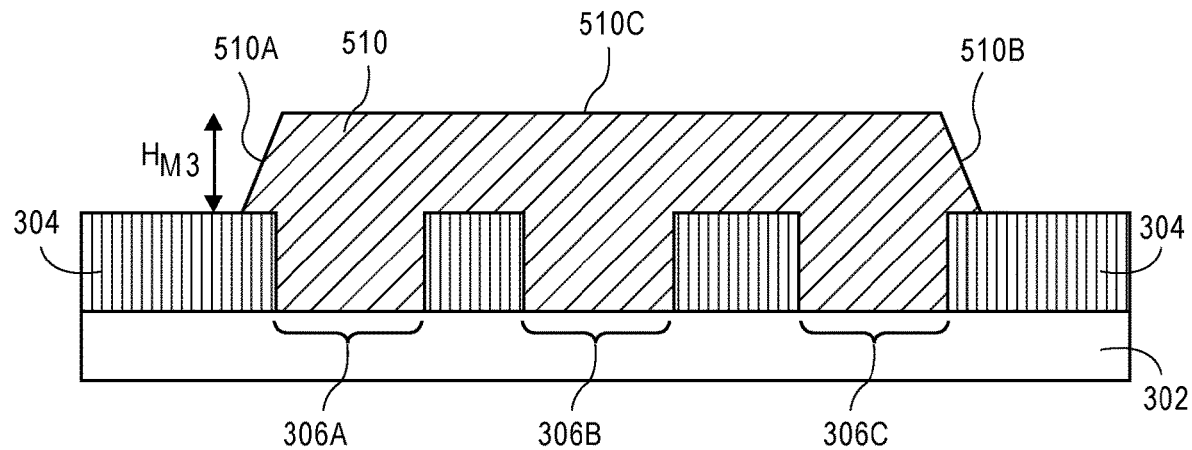
FIGS. 5A-5D illustrate cross-sectional views representing various operations in a method of fabricating a guard ring structure where adjacent sidewalls of the group III-N semiconductor disposed in the plurality of ring openings are completely merged, in accordance with embodiments of the present invention.

In an embodiment of the present invention, the guard ring structure 100 also includes a plurality of rings of group III-N semiconductor material 110 where the adjacent sloped sidewalls of the group III-N semiconductor material 110A, 110B and 110C are partially merged (as is depicted in FIG. 4A). In a further embodiment, guard ring structure 100 also includes a plurality of guard rings where the adjacent sidewalls of the group III-N semiconductor material 110A, 110B and 110C are fully merged (as is depicted in FIG. 5A). In one such embodiment, the uppermost surfaces of the group III-N semiconductor material 110A, 110B and 110C merge to form a continuous planar uppermost surface.

In an embodiment, the guard ring structure 100 is disposed on an n-doped region 128 of the substrate 102. In one such embodiment, the n-doped region 128 extends continuously from the region below the ring opening 106A to the region below the ring opening 106C. In another embodiment, the n-doped region 128 is not continuous below each of the plurality of ring openings 106A, 106B and 106C but, broken into smaller separate n-doped regions below each of the respective ring openings (not shown).

In an embodiment, the group III-N semiconductor material 110 has a high carrier mobility of greater than 500 cm$^2$ V$^{-1}$. In an embodiment, the group III-N semiconductor material 110 is a GaN layer. In other embodiments, group III-N semiconductor material 110 includes one or more contact alloys of GaN, such as AlGaN, AlInN, or a quaternary alloy of GaN including at least one group III element and nitrogen, such as In$_x$Al$_y$Ga$_{1-x-y}$N, where x ranges from 0.01-0.1 and y ranges from 0.01-0.1. In an embodiment, the group III-N semiconductor material 110 includes an n-type dopant. In one such embodiment, the doped group III-N semiconductor material 110 includes an n-type dopant material such as but not limited to Si, Ge or Al. In one such embodiment, the n-type dopant species is silicon. In one such embodiment, the n-type dopant has a dopant density that is at least 1e18/cm$^3$. In an embodiment, the group III-N semiconductor material 110 has a material thickness in the range of 100 nm-3 um. In an embodiment, a wide band gap (3.4 eV) material such as GaN offers a significant advantage against silicon (1.12 eV) as a higher band gap translates to a higher bond strength. In an embodiment, a higher bond strength in GaN provides more resistance from stress during mechanical sawing of a die to form individual microprocessors.

In an embodiment, the contact group III-N semiconductor material 112 includes a material that has a lower bandgap than the group III-N semiconductor material 110. In an embodiment, contact group III-N semiconductor material 112 includes a ternary group III-N semiconductor material. In an embodiment, the ternary group III-N semiconductor material includes a material such as In$_x$Ga$_{1-x}$N. where x ranges from 0.01-0.2. The bandgap of In$_x$Ga$_{1-x}$N. when x ranges from 0.01-0.2 is less than the bandgap of the group III-N semiconductor material 110. In an embodiment, the contact group III-N semiconductor material 112 includes a dopant that is an n-type dopant. Addition of dopants serves to lower the resistivity of the contact group III-N semiconductor material 112. In an embodiment, the n-type dopant includes a dopant species such as Si or Ge. In one such embodiment, the n-type dopant is silicon. In an embodiment, the contact group III-N semiconductor material 112 has an n-type dopant density of at least 1e18/cm$^3$. In an embodiment, the contact group III-N semiconductor material 112 has a thickness that is approximately in the range of 50-200 nm.

In an embodiment, the substrate 102 includes a semiconductor material such as but not limited to silicon, silicon germanium (Ge) or silicon carbide (SiC). In an embodiment, insulator layer 104 includes materials such as, but not limited to silicon dioxide (SiO$_2$), carbon doped oxide (CDO), silicon nitride. In an embodiment, insulator layer 104 has a thickness in the range of 30 nm-200 nm. In an embodiment, the ILD film 114 includes a material such as but not limited to silicon dioxide, silicon carbide or carbon-doped silicon oxide. In an embodiment, the conductive interconnects 120A, 120B and 120C include various layers of metals such as but not limited to W, Ti, Al, Ni or Cu or conductive alloys such as TiN or TaN.

Figure 2A:
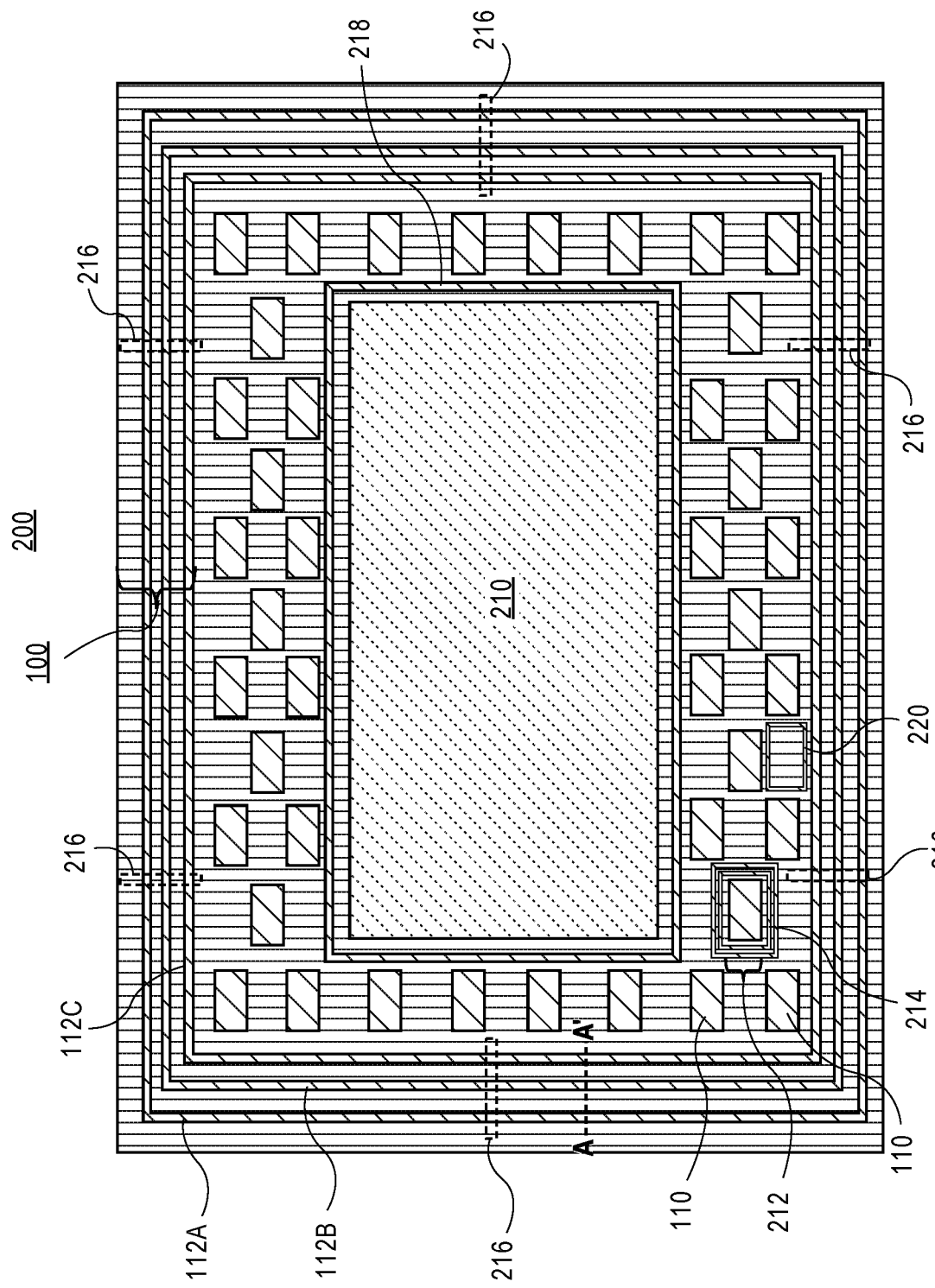
FIG. 2A illustrates a plan view of a guard ring structure surrounding a die.

FIG. 2A illustrates a plan view of a die 200 presented in accordance with an embodiment of the present invention. The plan view illustration is taken along the line A-A' in the cross sectional illustration of FIG. 1. In an embodiment, the die 200 includes a silicon wafer with pockets of group III-N semiconductor material 110. The die 200 includes a guard ring structure 100 formed from rings of group III-N semiconductor material 110, of which the uppermost surfaces of the group III-N semiconductor material 110A,110B and 110C are depicted in FIG. 2A. The guard ring structure 100 surrounds the periphery of die 200. The die 200 has a silicon area 210 which may also have a surrounding guard ring structure 218.

In an embodiment, the die 200 further includes a plurality of device areas 212 formed of group III-N semiconductor material 110 disposed on the substrate 102. In an embodiment, at least one of the device areas 212 is surrounded by a smaller guard ring structure 214 to isolate circuit elements formed in the device region 212 from other circuits formed in die 200. In an embodiment, the smaller guard ring structure 214 includes at least one guard ring and typically a plurality of ring structures made from the group III-N semiconductor material 110. FIG. 2 illustrates for example, a smaller guard ring structure 214 having two rings of group III-N semiconductor material 110. In an embodiment, a smaller guard ring structure 218 also encloses a portion of the substrate 102 where is there no group III-N semiconductor material 110. In an embodiment, locations of the lateral conductive bridges 124 and 126, described above in FIG. 1 are illustrated by dashed lines 216. In an embodiment, the lateral conductive bridges 124 and 126 are distant from each other by at least 100 nm.

Figure 2B:
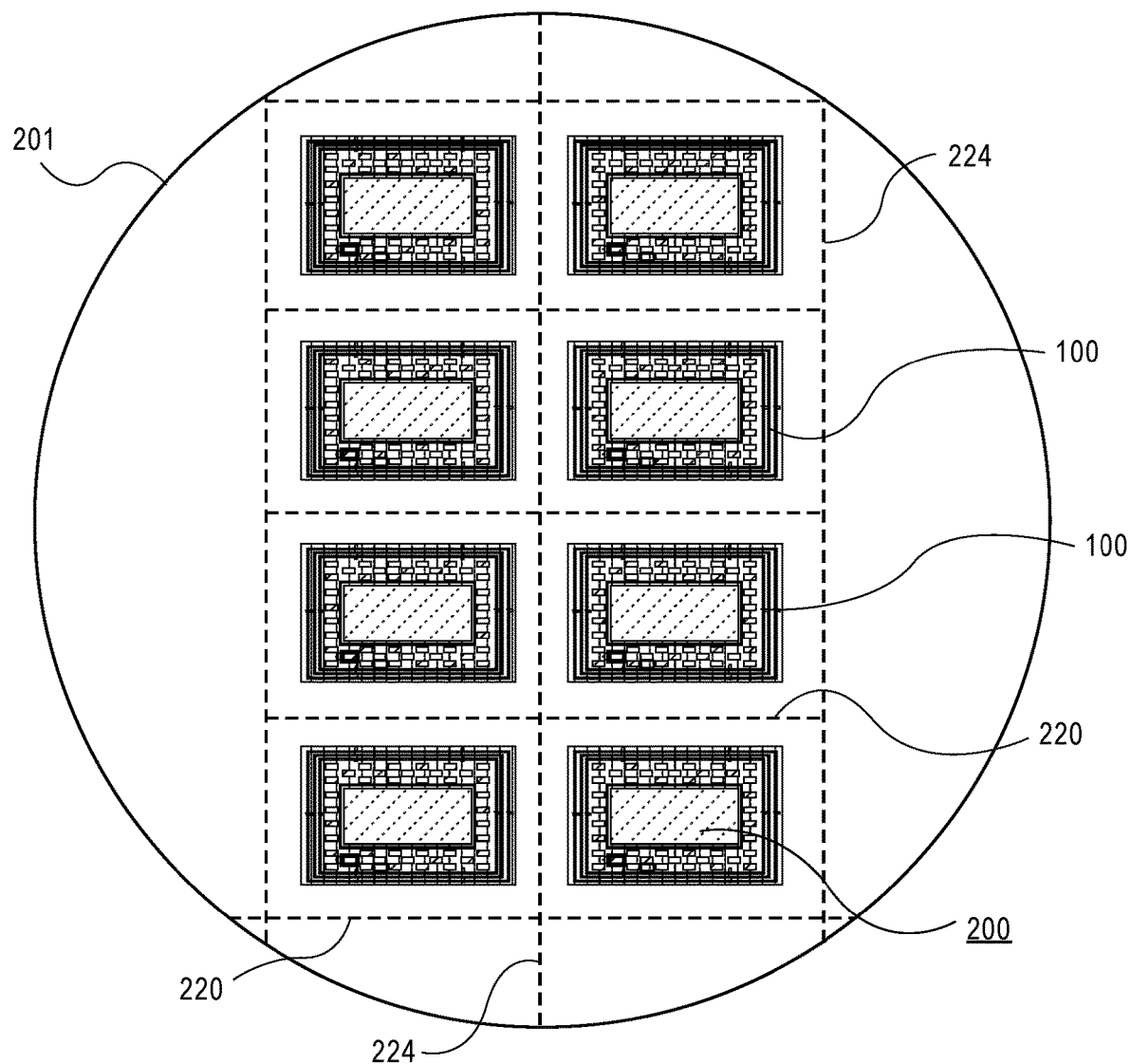
FIG. 2B illustrates a plan view of a wafer containing a plurality of die arranged in vertical and horizontal arrays.

FIG. 2B illustrates a plan view of a wafer 201 containing a plurality of die 200 arranged in vertical and horizontal array. The plurality of die 200 are separated after sawing along vertical and horizontal saw streets 220 and 224 respectively. Die saw stress is imparted to the guard ring structure 100 in each die 200 during the sawing process.

FIGS. 3A-3H illustrate cross-sectional and plane views representing various operations in a method of fabricating a guard ring structure in accordance with embodiments of the present invention.

Figure 3A:
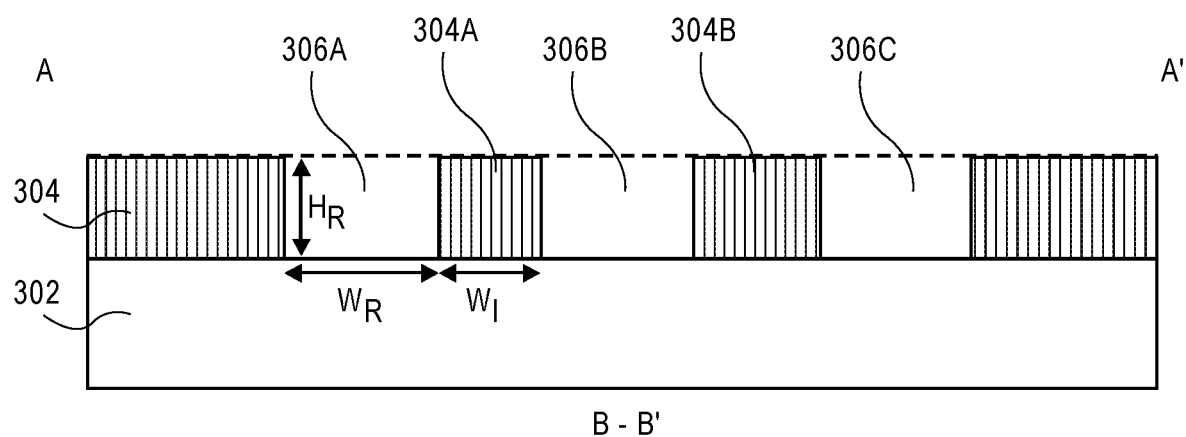
FIGS. 3A-3H illustrate cross-sectional views representing various operations in a method of fabricating a guard ring structure in accordance with embodiments of the present invention.
Figure 3A:
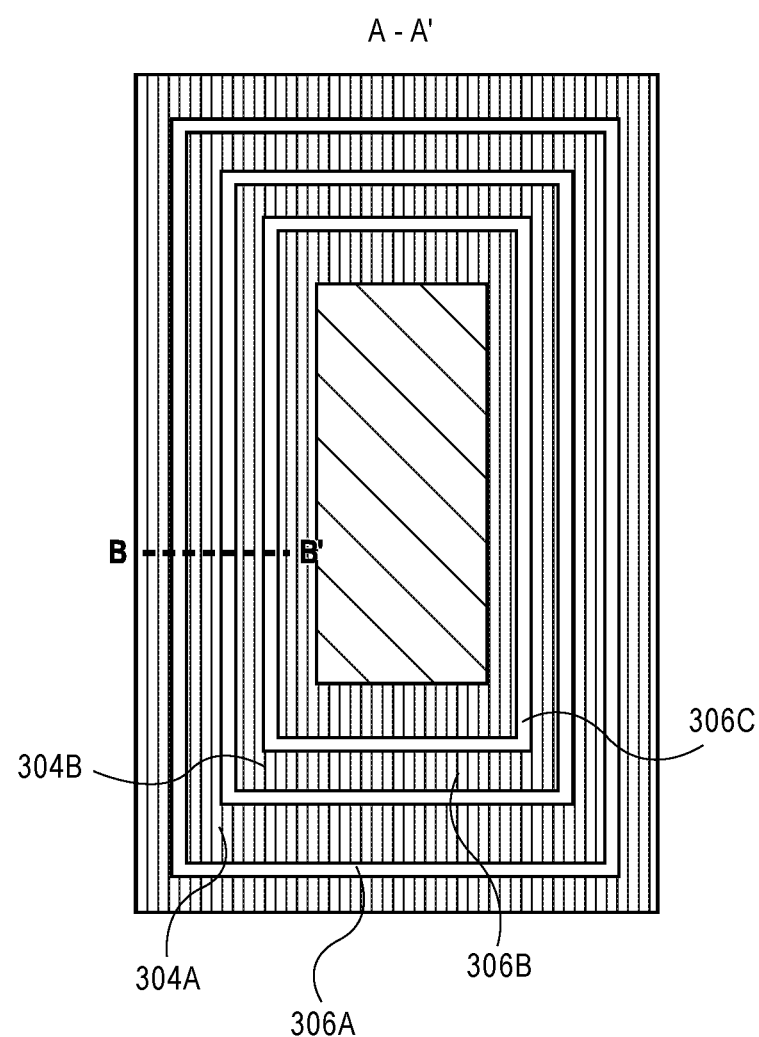

FIG. 3A illustrates a cross sectional and a plan view of a patterned insulator layer 304 formed above a substrate 302. In an embodiment, a plurality of ring openings 306A, 306B and 306C are formed in the insulator layer 304 by a plasma etch process. In an embodiment, the plurality of ring openings 306A, 306B and 306C provide locations where subsequent group III-N material will be formed. In an embodiment, formation of the plurality of ring openings 306A, 306B and 306C leads to formation of island portions 304A and 304B of the insulator layer 304. In an embodiment, the number of ring openings can range from 2-30. The plan view FIG. 3A (A-A'), illustrates the plurality of ring openings 306A, 306B and 306C and the island portions 304A and 304B of the patterned insulator layer 304 arranged in a concentric pattern.

In an embodiment, the substrate 302 includes a semiconductor material such as but not limited to silicon, silicon germanium (Ge) or silicon carbide (SiC). In a specific embodiment, the substrate is a monocrystalline silicon substrate. In an embodiment, insulator layer 304 includes materials such as, but not limited to silicon dioxide ($SiO_2$), carbon doped oxide (CDO), silicon nitride. In an embodiment, insulator layer 304 is formed using a deposition technique such as but not limited to plasma enhanced chemical vapor deposition (PECVD), chemical vapor deposition (CVD) or vertical diffusion furnace (VDF). In an embodiment, insulator layer 304 has a thickness in the range of 30 nm-200 nm and each of the plurality of ring openings 306A, 306B and 306C has a width that is at least 100 nm. In an embodiment, each of the island portions 304A and 304B has a width, $W_I$, that ranges from 250 nm-1000 nm. In an embodiment, the plurality of ring openings 306A, 306B and 306C have a height, $H_R$, width, $W_R$, and a spacing between each opening (width of island) $W_I$, chosen to influence the shape and size of the subsequent group III-N semiconductor material. In an embodiment, the various openings have a width, $W_R$, that are approximately equal to each other. In other embodiments, the width, $W_R$, is unequal between the plurality of ring openings 306A, 306B and 306C. In an embodiment, $W_I$, between each opening is approximately the same. In other embodiments the spacing $W_I$, between each ring opening are different.

Figure 3B:
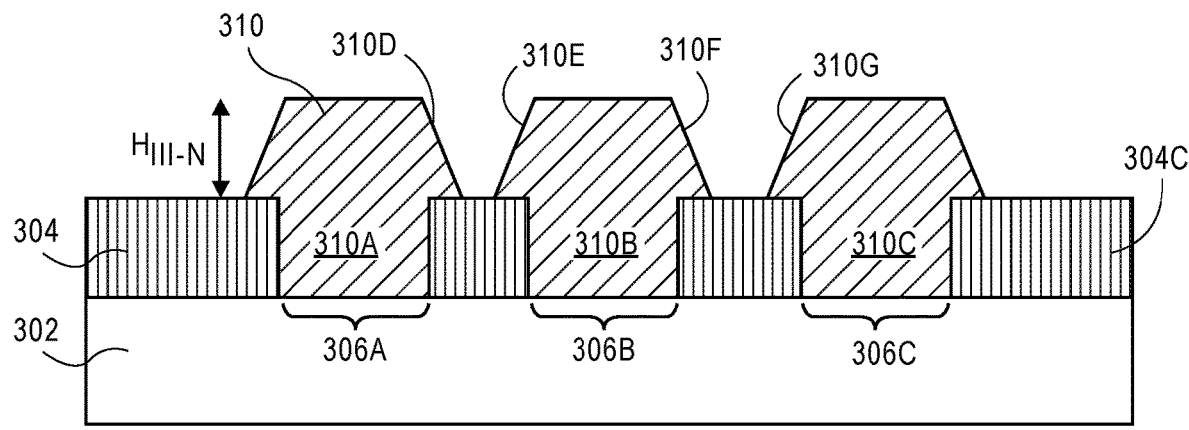

FIG. 3B illustrates the structure of FIG. 3A, following the formation of a group III-N semiconductor material 310 in each of the plurality of ring openings 306A, 306B and 306C on the substrate 302. In an embodiment, a first group III-N semiconductor material 310A is grown to fill the ring opening 306A, a second group III-N semiconductor material 310B is grown to fill the ring opening 306B and a third group III-N semiconductor material 310C is grown to fill the ring opening 306C. In an embodiment, the group III-N semiconductor material 310 is grown by a metal oxide chemical vapor deposition (MOCVD) process. In an embodiment, the group III-N semiconductor material 310 is grown by an MOCVD process at a temperature in the range of 900-1050 degrees Celsius. In an embodiment, portions of each of the first, second and third group III-N semiconductor material 310A, 310B and 310C, respectively are also grown on portions of the uppermost surface of the patterned insulator layer 304 in an MOCVD process known as lateral epitaxial overgrowth (LEO). The LEO process may reduce dislocation density in epitaxially grown group III-N semiconductor material 310 to a level below $10^6$ defects/cm$^2$. In an embodiment, each of the first, second and third group III-N semiconductor material 310A, 310B and 310C are grown to have a pair of sloped sidewalls and a substantially planar uppermost surface. In an embodiment, each of the first, second and third group III-N semiconductor material 310A, 310B and 310C, respectively, are formed to be distant from each other by at least 100 nm as is depicted in FIG. 3B. In an embodiment, each of the first, second and third group III-N semiconductor material 310A, 310B and 310C, respectively are grown to a thickness, $H_{III-N}$, as measured from the uppermost surface of the patterned insulator layer 304. In an embodiment, $H_{III-N}$ is 100 nm-3 microns.

In an embodiment, the group III-N semiconductor material 310 has a material composition such as is described above in association with group III-N semiconductor material 110. In an embodiment, the group III-N semiconductor material 310 is n-doped. In an embodiment, the group III-N semiconductor material 310 is a GaN layer. In an embodiment, the group III-N semiconductor material 310 is a GaN layer having an n-type dopant. In an embodiment, the n-type dopants are introduced into the group III-N semiconductor material 310 during the MOCVD growth process. In an embodiment, each of the first, second and third n-doped GaN group III-N semiconductor material 310A, 310B and 310C, respectively are grown in an MOVCD process to have sloped sidewalls with a semipolar crystal plane (11-22) and an uppermost surface with a (110-1) orientation.

Figure 9:
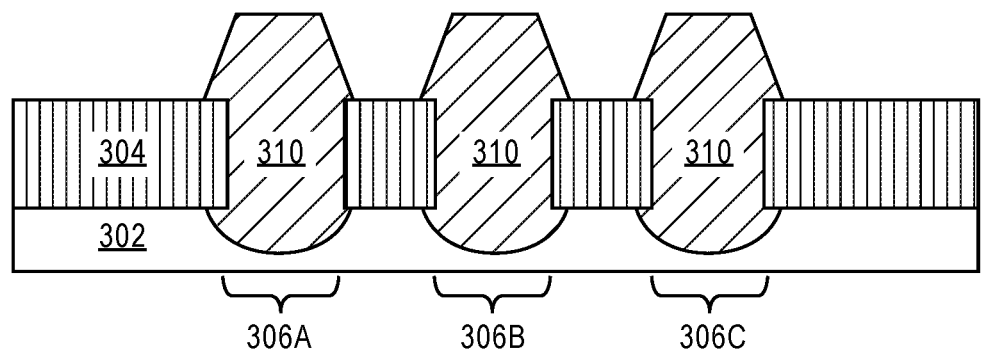
FIG. 9 illustrates a cross-sectional view of a group III-N semiconductor material with a portion that is disposed in a plurality of openings in the substrate.

In a further embodiment, the group III-N semiconductor material 310 has a portion that is disposed in the substrate 302 as depicted in the structure of FIG. 9. Recesses may be first formed in the substrate after forming the ring openings 306A, 306B and 306C. In an embodiment, group III-N semiconductor material 310 may be first formed in the recesses in the substrate by an MOCVD growth process and then grows up through the ring openings 306A, 306B and 306C, in a manner as described above in association with FIG. 3B. The recess in the substrate may extend laterally below portions of the patterned insulator layer 304, such as is illustrated in FIG. 9.

Figure 3C:
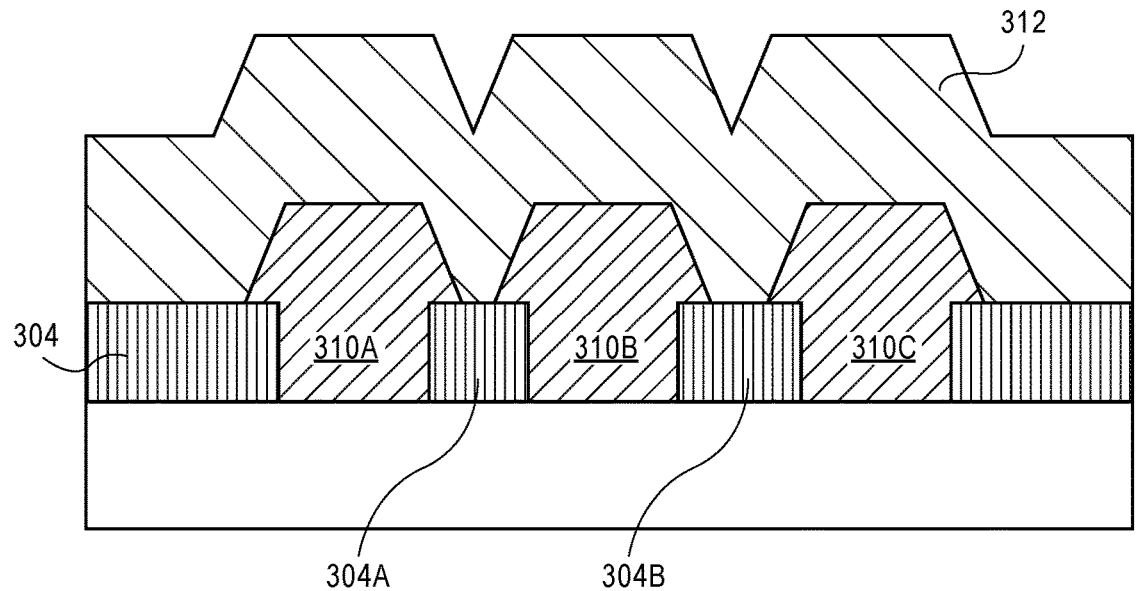

FIG. 3C illustrates the structure of FIG. 3B, following the deposition of an interlayer dielectric (ILD) film 312 on the first, second and third group III-N semiconductor material 310A, 310B and 310, respectively, and on the uppermost surface of the patterned insulator layer 304. In an embodiment, the ILD film 312 is also deposited on the uppermost surface of the island portions 304A and 304B of the patterned insulator layer 304. In an embodiment, the ILD film 312 includes a material such as but not limited to silicon dioxide, silicon carbide or carbon-doped silicon oxide. In an embodiment, the interlayer dielectric (ILD) film 312 is blanket deposited over the structure of FIG. 3B. In an embodiment, ILD film 312 is blanket deposited using a plasma enhanced chemical vapor deposition (PEVCD) or a chemical vapor deposition (CVD) process.

Figure 3D:
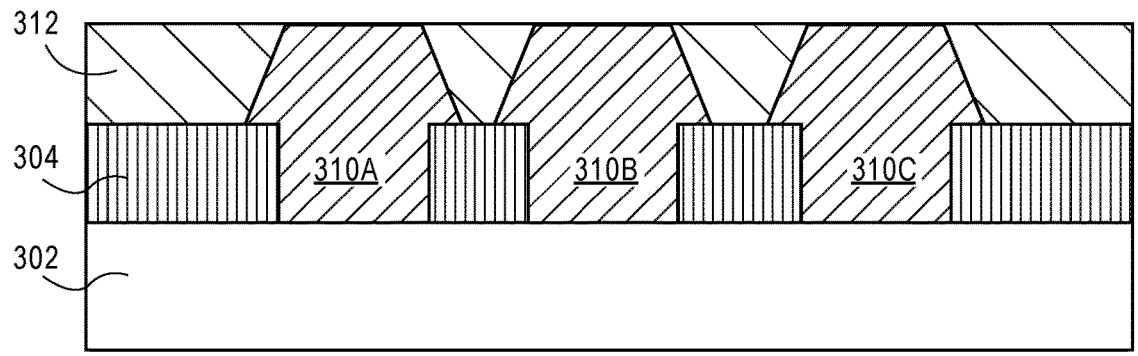

FIG. 3D illustrates the structure of FIG. 3C, following a process to planarize the ILD film 312 and uppermost portions of the first, second and third group III-N semiconductor material 310A, 310B and 310C, respectively. In an embodiment, the planarization process includes a chemical mechanical planarization (CMP) process. In an embodiment, the CMP process removes the excess ILD film 312 deposited above and in between the first, second and third group III-N semiconductor material 310A, 310B and 310C, respectively, and portions of the excess ILD film deposited above the insulator layer 304. In an embodiment, the planarization process exposes the uppermost surface of each of the first, second and third group III-N semiconductor material 310A, 310B and 310C, respectively. In an embodiment, the ILD film 312 and each of the first, second and third group III-N semiconductor material 310A, 310B and 310C, respectively have uppermost surfaces that are coplanar or substantially coplanar as a result of the CMP process.

Figure 3E:
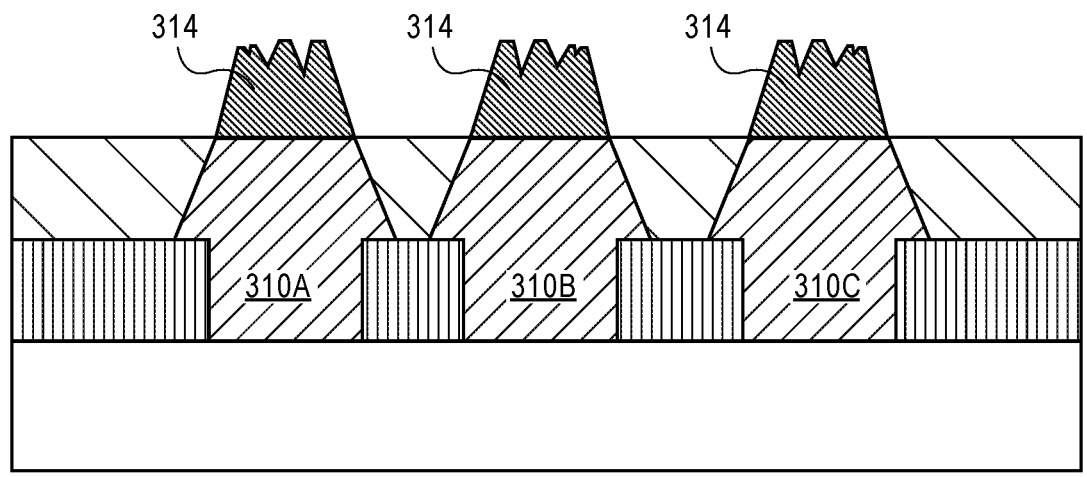

FIG. 3E illustrates the structure of FIG. 3D following the formation of a contact group III-N semiconductor material 314 on each of the first, second and third group III-N semiconductor material 310A, 310B and 310C, respectively. In an embodiment, the contact group III-N semiconductor material 314 is grown by an MOCVD process at a process temperature in the range of 900-1050 degrees C. In an embodiment, the contact group III-N semiconductor material 314 has sloped sidewalls as a result of the triangular shaped growth. In an embodiment, the contact group III-N semiconductor material 314 is a semiconductor material such as InGaN. In an embodiment, the contact group III-N semiconductor material 314 includes a dopant material that is an n-type dopant. In an embodiment, the n-type dopant may include materials such as but not limited to Si or Ge. In one embodiment, the n-type dopant material is silicon. In an embodiment, the n-type dopant material has a dopant density that is at least $1e18/cm^3$. In an embodiment, the n-type dopant density of the contact group III-N semiconductor material 314 is higher than the dopant density of the group III-N semiconductor material 310.

Figure 3F:
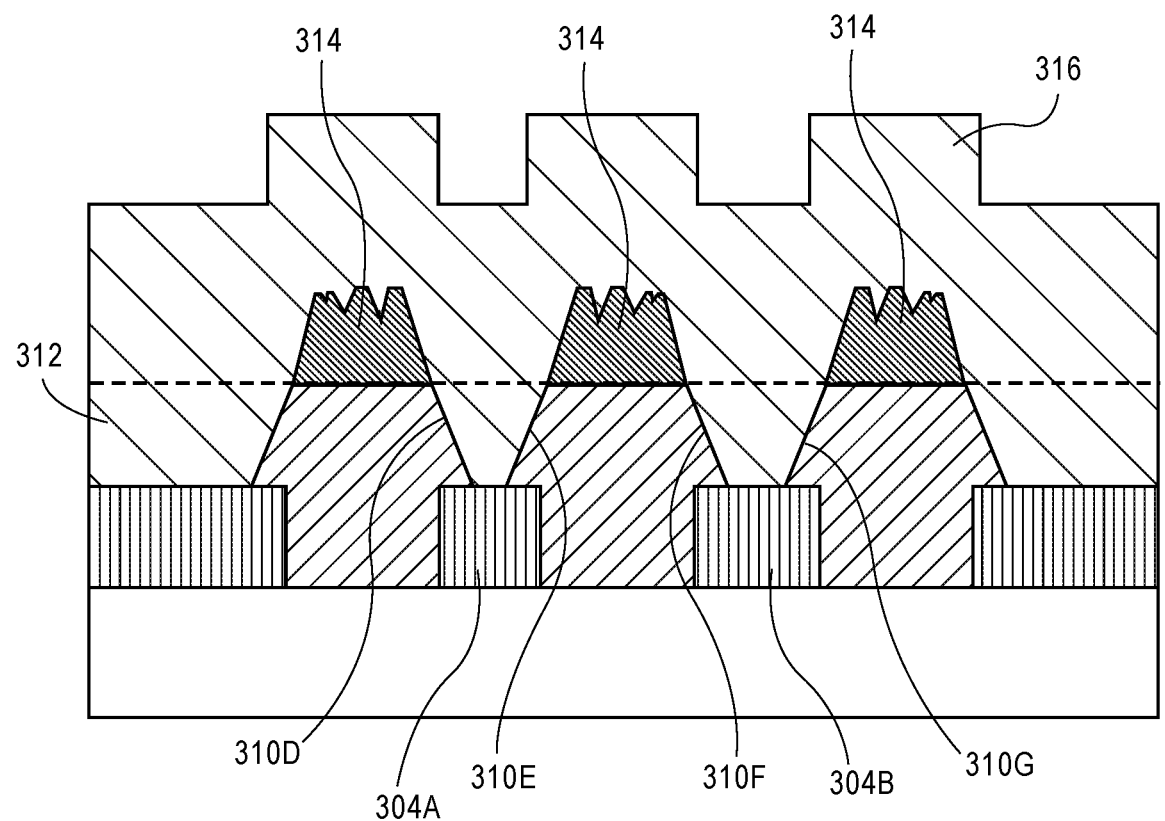

FIG. 3F illustrates the structure of FIG. 3E, following the deposition of a second ILD film 316 on the contact group III-N semiconductor material 314 and on the uppermost surface of the ILD film 312. In an embodiment, the second ILD film 316 is blanket deposited using a PECVD process. In an embodiment, the second ILD film 316 has a material composition similar to the material composition of the first ILD film 312 to ensure that the die saw stress does not create dislocations between the interface between the first ILD film 312 and the second ILD film 314.

Figure 3G:
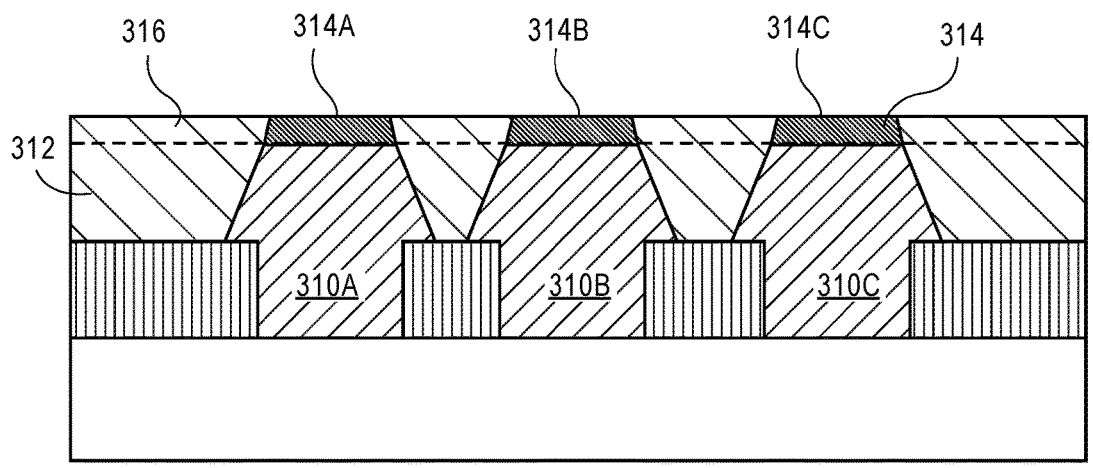

FIG. 3G illustrates the structure of FIG. 3F, following a process to planarize the second ILD film 316 and portions of the contact group III-N semiconductor material 314. In an embodiment, the planarization process includes a chemical mechanical planarization (CMP) process. In an embodiment, the CMP process forms substantially planar uppermost surfaces 314A, 314B and 314C of the contact group III-N semiconductor material 314 adjacent to the planarized second ILD film 316. In an embodiment, the resulting uppermost surface of the second ILD film 316 and the uppermost surfaces 314A, 314B and 314C of the contact group III-N semiconductor material 314 are coplanar or substantially coplanar as a result of the CMP process.

Figure 3H:
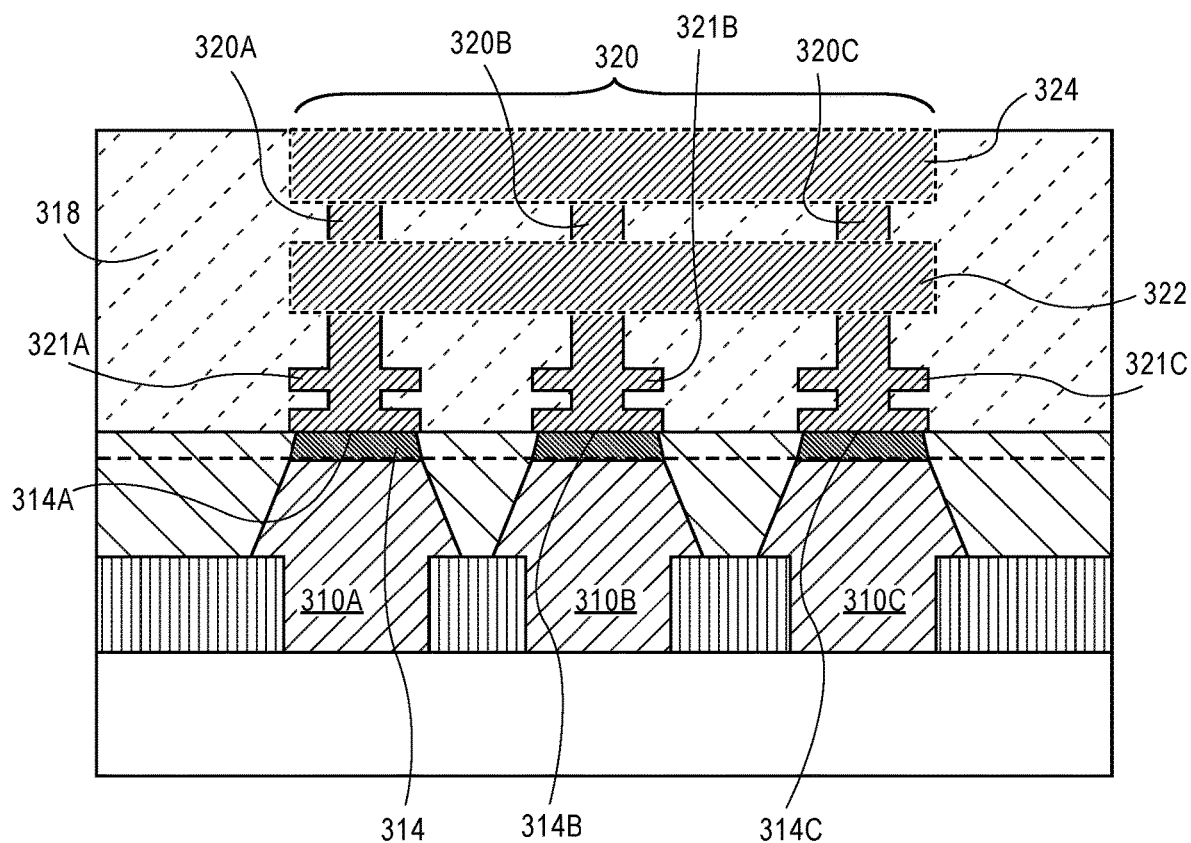

FIG. 3H illustrates the structure of FIG. 3G, following a process to form a conductive interconnect structure 320 in a dielectric layer 318. In an embodiment, conductive interconnect structure 320 includes a plurality of conductive interconnects 320A, 320B and 320C formed on the uppermost surface 314A, 314B and 314C of the contact group III-N semiconductor material 314. In an embodiment, the layers of interconnects in the plurality of conductive interconnects 320A, 320B and 320C are formed by a dual damascene process as is well known in the art. Typically, one or more layers of metal rings, 321A, 321B and 321C are formed during the dual damascene process. These metal rings are interconnected by intervening vias. The metal rings 321A, 321B and 321C run parallel to the rings of group III-N semiconductor material 310A, 310B and 310C, respectively. In an embodiment, lateral conductive bridges 322 and 324 are formed to connect the vertical portions of the conductive interconnects 320A, 320B and 320C. The formation of rings and bridges intervened with vias in the conductive interconnect structure 320 may help prevent cracks arising from stresses during die sawing to propagate linearly into sensitive device areas.

FIGS. 4A-4D illustrate cross-sectional views representing various operations in a method of fabricating a guard ring structure, where adjacent sidewalls of the group III-N semiconductor material disposed in the plurality of ring openings are partially merged, in accordance with embodiments of the present invention.

FIG. 4A illustrates the structure of FIG. 3A, following the formation of a group III-N semiconductor material 410, in each of the plurality of ring openings 306A, 306B and 306C on the substrate 302. In an embodiment, an MOCVD growth process is utilized to perform lateral epitaxial overgrowth of the group III-N semiconductor material 410 resulting in a partial merger of the first and the second group III-N semiconductor material 410A and 410B and a partial merger of the second and the third group III-N semiconductor material 410B and 410C, respectively. In an embodiment, the group III-N semiconductor material 410 has a material composition that is substantially similar to the material composition of the group III-N semiconductor material 310. The resulting partially merged group III-N semiconductor material 410 may be structurally more resistant to die saw stress compared to individual islands of the first, second and third group III-N semiconductor material 310A, 310B and 310C respectively described above in association with FIG. 3B.

In an embodiment, the first group III-N semiconductor material 410A has a sloped sidewall 410D that is partially merged with a sloped sidewall 410E of the second group III-N semiconductor material 410B. In an embodiment, partial merger between the two sidewalls 410D and 410E covers the uppermost surface of the island portion 304A of the patterned insulator layer 304. In an embodiment, the partial merger of the two sidewalls 410D and 410E results in a merged portion having a height, $H_V$, as measured from the uppermost surface of the patterned island portion 304A of the patterned insulator layer 304. In an embodiment, a V-shaped groove region 411A is formed between the first and the second group III-N semiconductor material 410A and 410B, respectively, in the partially merged structure. In an embodiment, the height, $H_V$, ranges from 10-90% of the total height, $H_{M2}$, of group III-N semiconductor material 410 as measured from above the insulator. In an embodiment, an optimal height, $H_V$, ranges from 40-60% of the total height, $H_M$, of the group III-N semiconductor material 410. In an embodiment, the total height, $H_M$, ranges from 2-3 micrometers and $H_V$, ranges from 0.8-1.8 micrometers.

In an embodiment, a sidewall 410F of the second group III-N semiconductor material 410B merges with a sidewall 410G of the third group III-N semiconductor material 410C. In an embodiment, partial merger between the two sidewalls 410F and 410F leads to a second merged portion having a height, $H_W$, and a second V-shaped groove region 411B in the partially merged structure. In an embodiment, the height, $H_W$, is similar to the height $H_V$.

Figure 4B:
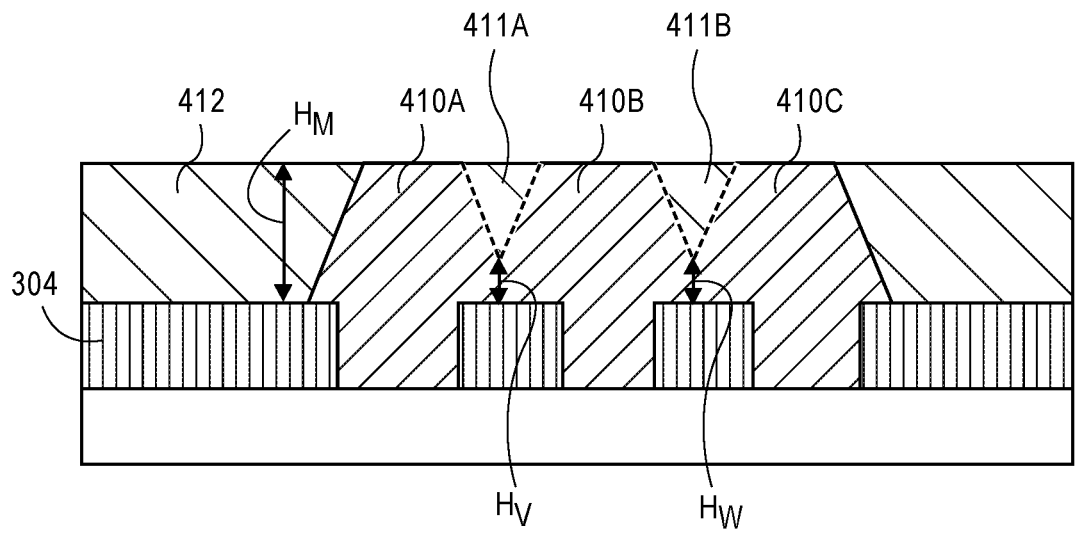

FIG. 4B illustrates the structure of FIG. 4A, following the formation of an ILD film 412 on the group III-N semiconductor material 410 and on the patterned insulator layer 304. In an embodiment, an interlayer dielectric (ILD) film 412 is blanket deposited on the structure of FIG. 4A. In an embodiment, the ILD film 412 includes a material such as but not limited to silicon dioxide, silicon carbide or carbon-doped silicon oxide. The ILD film 412 may be blanket deposited to a thickness that completely fills the V-shaped groove region 411A and the V-shaped groove region 411B. In an embodiment, the ILD film 412 is deposited using a plasma enhanced chemical vapor deposition (PEVCD) or a chemical vapor deposition (CVD) process.

In an embodiment, a planarization process is carried out to planarize uppermost portions of the first, second and third group III-N semiconductor material 410A, 410B and 410C, respectively. In an embodiment, the planarization process forms isolated portions 412A and 412B of the ILD film 412 in the V-shaped groove regions 411A and 411B, respectively.

The uppermost surfaces of the first, second and third group III-N semiconductor material 410A, 410B and 410C, respectively, are substantially coplanar with the uppermost surface of the ILD 412 as result of the planarization process.

Figure 4C:
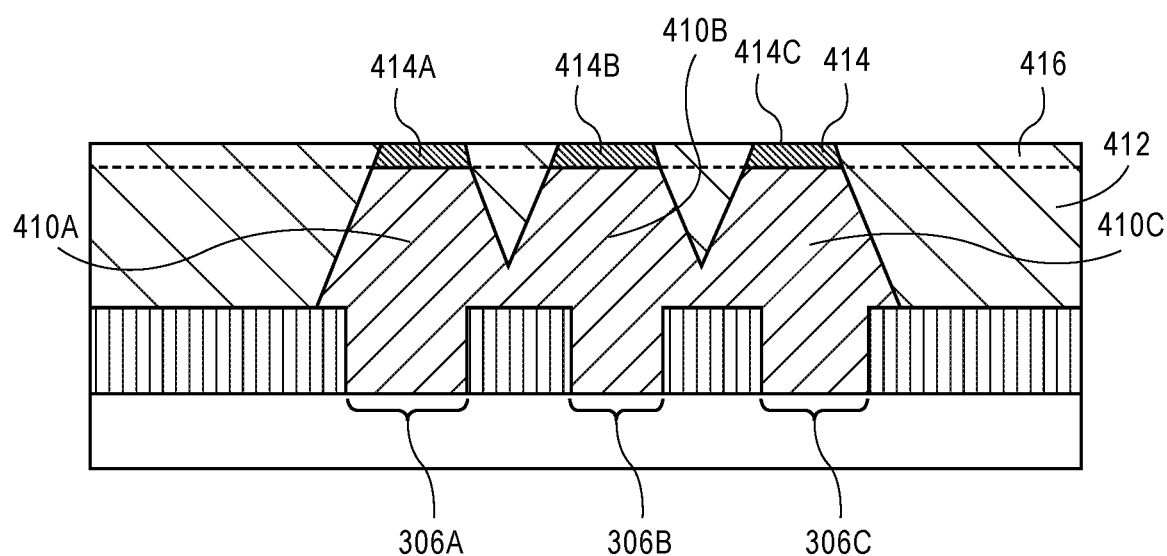

FIG. 4C illustrates the structure of FIG. 4B following the formation of a contact group III-N semiconductor material 414 on the group III-N semiconductor material 410 and a second ILD film 416 surrounding sidewalls of the contact group III-N semiconductor material 414. In an embodiment, the process of forming the contact group III-N semiconductor material 414 and the second ILD film 416 is similar to the process of forming the contact group III-N semiconductor material 314 and the second ILD film 316, described above in connection with FIGS. 3F-3G. In an embodiment, the contact group III-N semiconductor material 414 and the second ILD film 416 include materials such as materials utilized to form contact group III-N semiconductor material 314 and the second ILD film 316, respectively. In an embodiment, a planarization process is carried out to form planarized uppermost surfaces 414A, 414B and 414C of the contact group III-N semiconductor material 414. In an embodiment, the resulting uppermost surface of the second ILD film 416 and the uppermost surfaces 414A, 414B and 414C of the contact group III-N semiconductor material 414 are coplanar or substantially coplanar as a result of the planarization process.

Figure 4D:
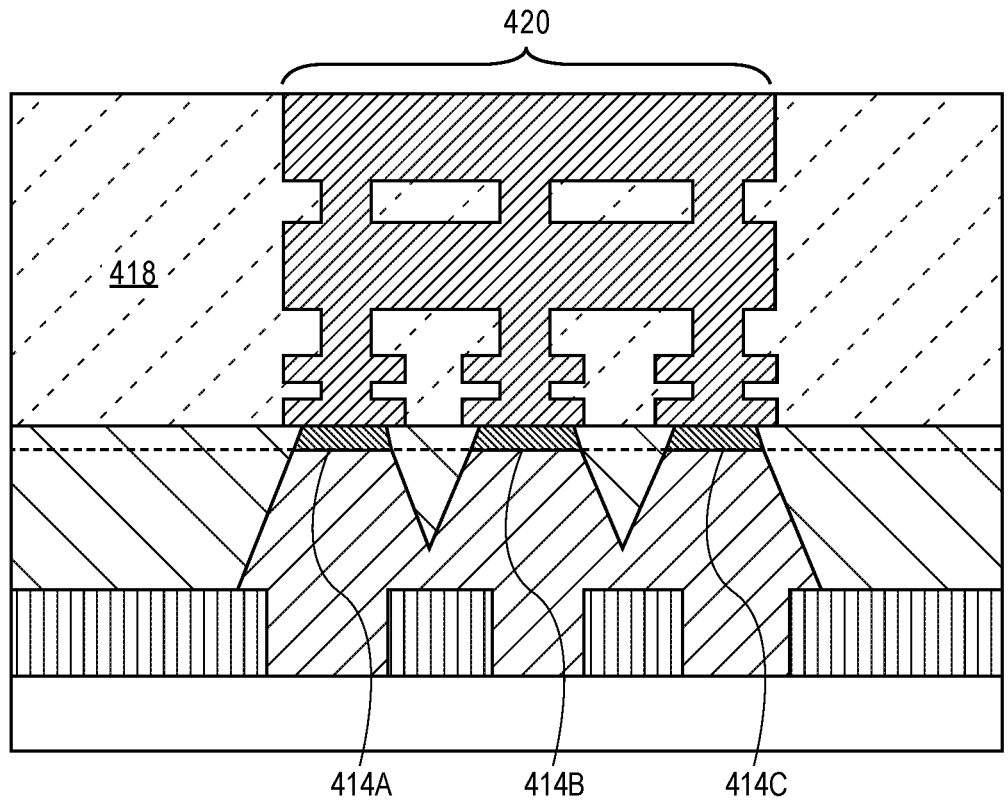

FIG. 4D illustrates the structure of FIG. 4C, following the formation of a plurality of conductive interconnects 420 on the uppermost surface 414A, 414B and 414C of contact group III-N semiconductor material 414 in a dielectric layer 418. In an embodiment, the methods and materials utilized to form conductive interconnects structure 420 in a dielectric layer 418 are similar to the methods and materials utilized to form conductive interconnect structure 320 in the dielectric layer 318 described in connection with FIG. 3H.

FIGS. 5A-5D illustrate cross-sectional views representing various operations in a method of fabricating a guard ring structure where adjacent sidewalls of the group III-N semiconductor material disposed in the plurality of ring openings are completely merged, in accordance with embodiments of the present invention.

FIG. 5A illustrates the structure of FIG. 3A, following the formation of a group III-N semiconductor material 510 on the substrate 302, in the plurality of ring openings 306A, 306B and 306C. In an embodiment, the lateral epitaxial overgrowth (LEO) during an MOCVD growth process causes the group III-N semiconductor material 510 to grow beyond the boundaries of the plurality of ring openings 306A, 306B and 306C and merge completely to form a single continuous group III-N semiconductor material 510 as is depicted in the cross-sectional illustration of FIG. 5A. In an embodiment, the group III-N semiconductor material 510 is grown to have a single pair of sidewalls 510A and 510B that are sloped, and an uppermost surface 510C that is substantially flat. In an embodiment, the total height, $H_{M3}$, of group III-N semiconductor material 510 ranges from 2-3 microns above the uppermost surface of the patterned insulator layer 304.

Figure 5B:
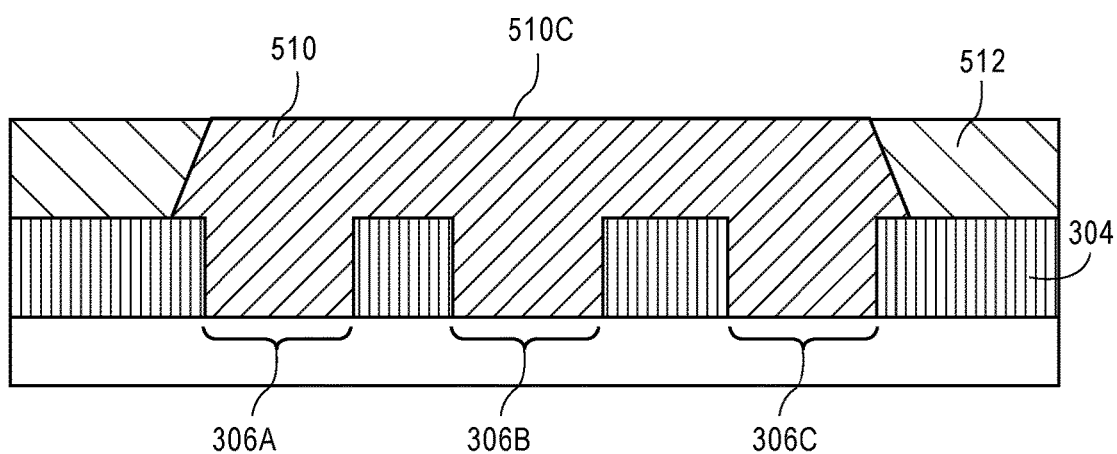

FIG. 5B illustrates the structure of FIG. 5A, following the deposition of an ILD film 512 on the group III-N semiconductor material 510 and on the patterned insulator layer 304, followed by a planarization process. In an embodiment, the materials and methods to form ILD film 512 is similar to the materials and methods utilized to form ILD film 312. In an embodiment, the planarization process is similar to the planarization process described in connection with FIG. 3D. In an embodiment, the resulting group III-N semiconductor material 510 and the ILD film 512 have planar uppermost surfaces that are co-planar or substantially coplanar. In an embodiment, the uppermost surface 510C of the group III-N semiconductor material 510 extends continuously above the plurality of ring openings 306A, 306B and 306C.

Figure 5C:
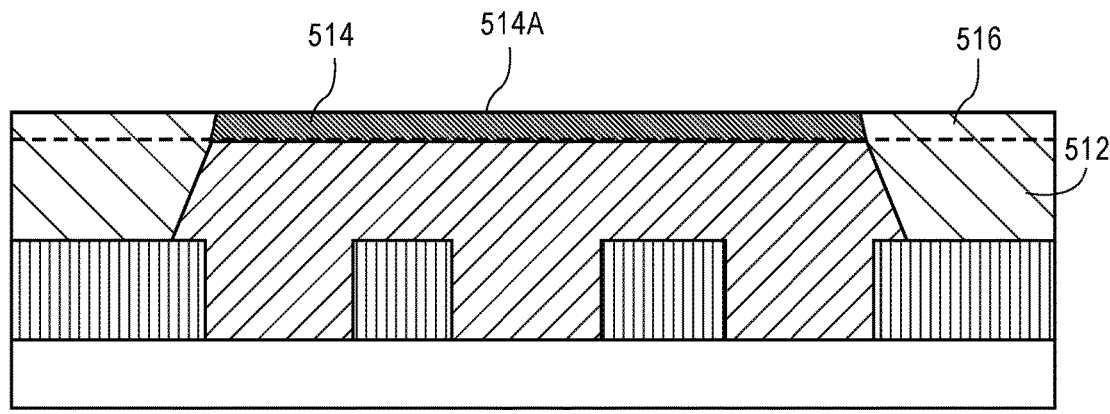

FIG. 5C illustrates the structure of FIG. 5B following the formation of a contact group III-N semiconductor material 514 on the group III-N semiconductor material 510, and a second ILD film 516 disposed on the ILD film 512 and surrounds sidewalls of the contact group III-N semiconductor material 514. In an embodiment, the process of forming the contact group III-N semiconductor material 514 and the second ILD film 516 is similar to the process of forming the contact group III-N semiconductor material 314 and the second ILD film 316, described above in connection with FIGS. 3F-3G. In an embodiment, a planarization process is carried out to form a planarized uppermost surface 514A of the contact group III-N semiconductor material 514 and a planarized uppermost surface of the second ILD film 516. In an embodiment, the resulting uppermost surface of the second ILD film 516 and the uppermost surface 514A of the contact group III-N semiconductor material 514 are coplanar or substantially coplanar as a result of the planarization process.

Figure 5D:
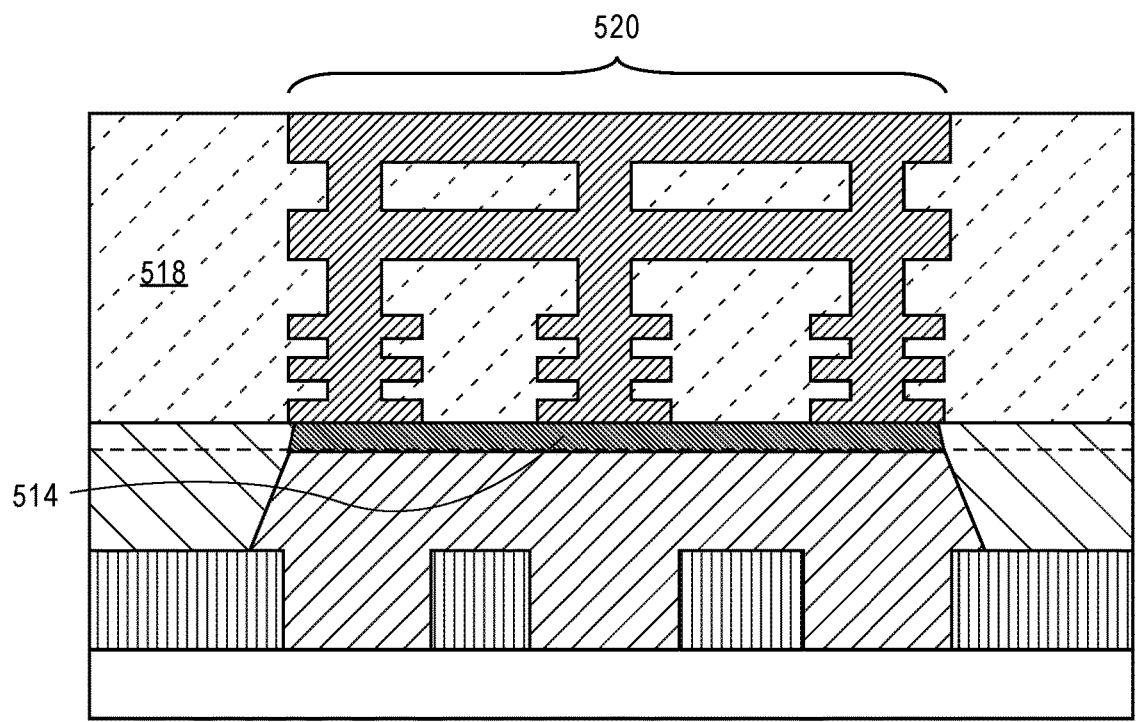

FIG. 5D illustrates the structure of FIG. 5C, following the formation of a conductive interconnect structure 520 in a dielectric layer 518 on the contact group III-N semiconductor material 514. In an embodiment, the methods and materials utilized to form conductive interconnect structure 520 in the dielectric layer 518 are similar to the methods and materials utilized to form conductive interconnect structure 320 in the dielectric layer 318 described in connection with FIG. 3H.

Figure 6:
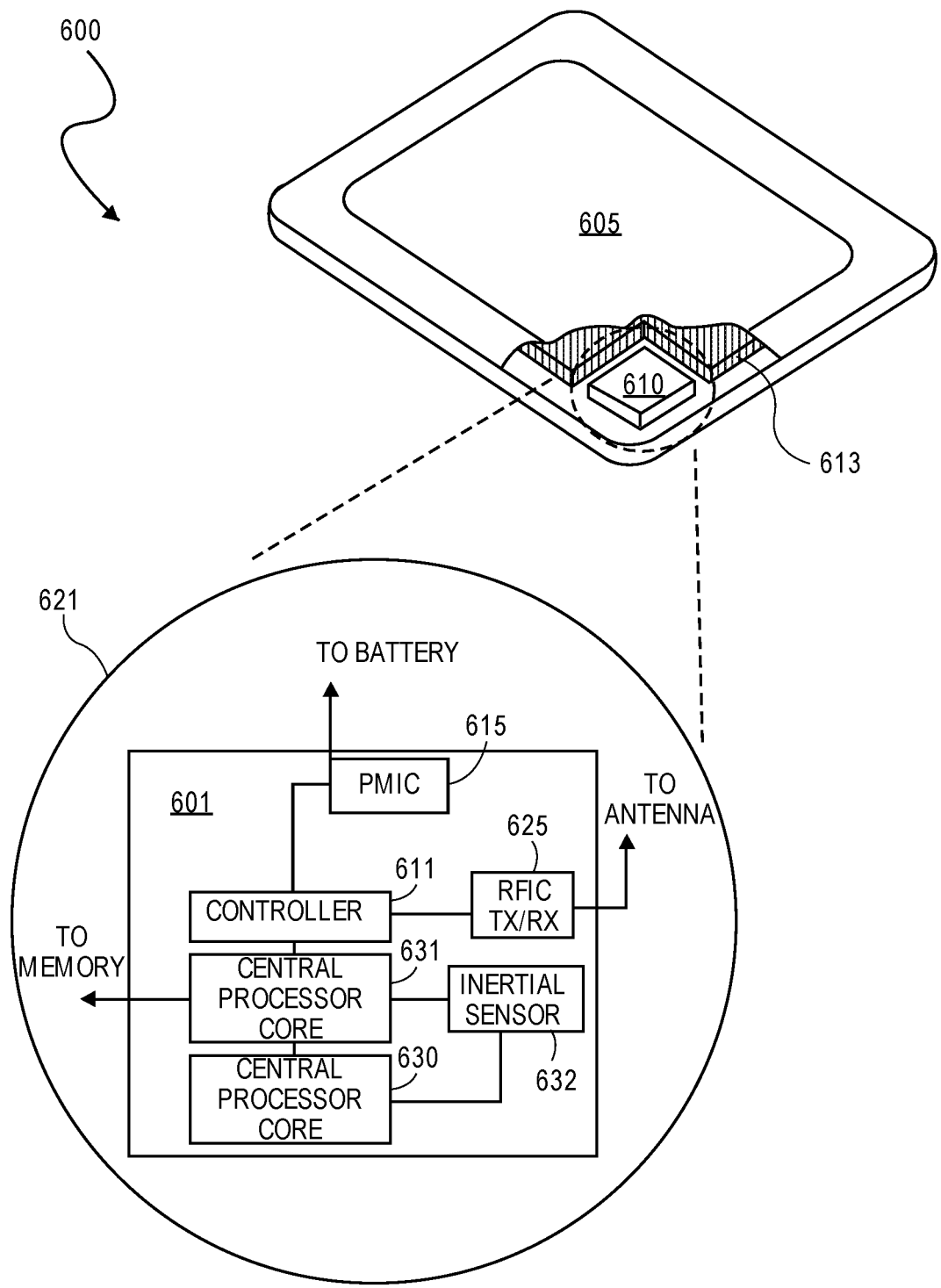
FIG. 6 illustrates a computing device in accordance with embodiments of the present invention.

FIG. 6 is a functional block diagram of a group III-N SoC implementation of a mobile computing platform, in accordance with an embodiment of the present invention. The mobile computing platform 600 may be any portable device configured for each of electronic data display, electronic data processing, and wireless electronic data transmission. For example, mobile computing platform 600 may be any of a tablet, a smart phone, laptop computer, etc. And includes a display screen 605 that is in the exemplary embodiment a touchscreen (e.g., capacitive, inductive, resistive, etc.) permitting the receipt of user input, the SoC 610, and a battery 613. As illustrated, the greater the level of integration of the SoC 610, the more of the form factor within the mobile computing platform 600 that may be occupied by the battery 613 for longest operative lifetimes between charging, or occupied by memory (not depicted), such as a solid state drive, for greatest functionality.

Depending on its applications, mobile computing platform 600 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, RF switches, a global positioning system (GPS) device, a compass, an accelerometer, a gyroscope, a speaker, a camera, and a mass storage device (such as hard disk drive, compact disk (CD), digital versatile disk (DVD), and so forth).

The SoC 610 is further illustrated in the expanded view 621. Depending on the embodiment, the SoC 610 includes a portion of a substrate 600 (i.e., a chip) upon which two or more of a power management integrated circuit (PMIC) 615, RF integrated circuit (RFIC) 625 including an RF transmitter and/or receiver, a controller thereof 611, and one or more central processor core 630, 631 is fabricated. The RFIC 625 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 625 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 615 and RFIC 625. In embodiments of the present invention, the PMIC 615 and RFIC 625 employ one or more guard ring structures surrounding transistor circuitry (e.g., guard ring structure 100). In further embodiments the PMIC 615 and RFIC 625 employing the guard ring structures 100 described herein are integrated with one or more of the controller 611 and processor cores 630, 631 provided in silicon CMOS technology monolithically integrated with the PMIC 615 and/or RFIC 625 onto the (silicon) substrate 600. It will be appreciated that within the PMIC 615 and/or RFIC 625, the high voltage, high frequency capable group III-N transistors described herein need not be utilized in exclusion to CMOS, but rather silicon CMOS may be further included in each of the PMIC 615 and RFIC 625.

The guard ring structures described herein may be specifically utilized where a high voltage swing is present (e.g., 8-10V battery power regulation, DC-to-DC conversion, etc. within the PMIC 615). As illustrated, in the exemplary embodiment the PMIC 615 has an input coupled to the battery 613 and has an output provide a current supply to all the other functional modules in the SoC 610. In a further embodiment, where additional ICs are provided within the mobile computing platform 600 but off the SoC 610, the PMIC 615 output further provides a current supply to all these additional ICs off the SoC 610. Particular embodiments of the group III-N transistors described herein permit the PMIC to operate at higher frequencies (e.g., 50× those possible in LDMOS implementations). In certain such embodiments, inductive elements within the PMIC (e.g., buck-boost convertors, etc.) may be scaled to much smaller dimensions. As such inductive elements in the PMIC account for 60-50% of chip area, embodiments of the PMIC implemented with the guard ring structures described herein offer a significant shrink over other PMIC architectures.

As further illustrated, in the exemplary embodiment the PMIC 615 has an output coupled to an antenna and may further have an input coupled to a communication module on the SoC 610, such as an RF analog and digital baseband module (not depicted). Alternatively, such communication modules may be provided on an IC off-chip from the SoC 610 and coupled into the SoC 610 for transmission.

Figure 7:
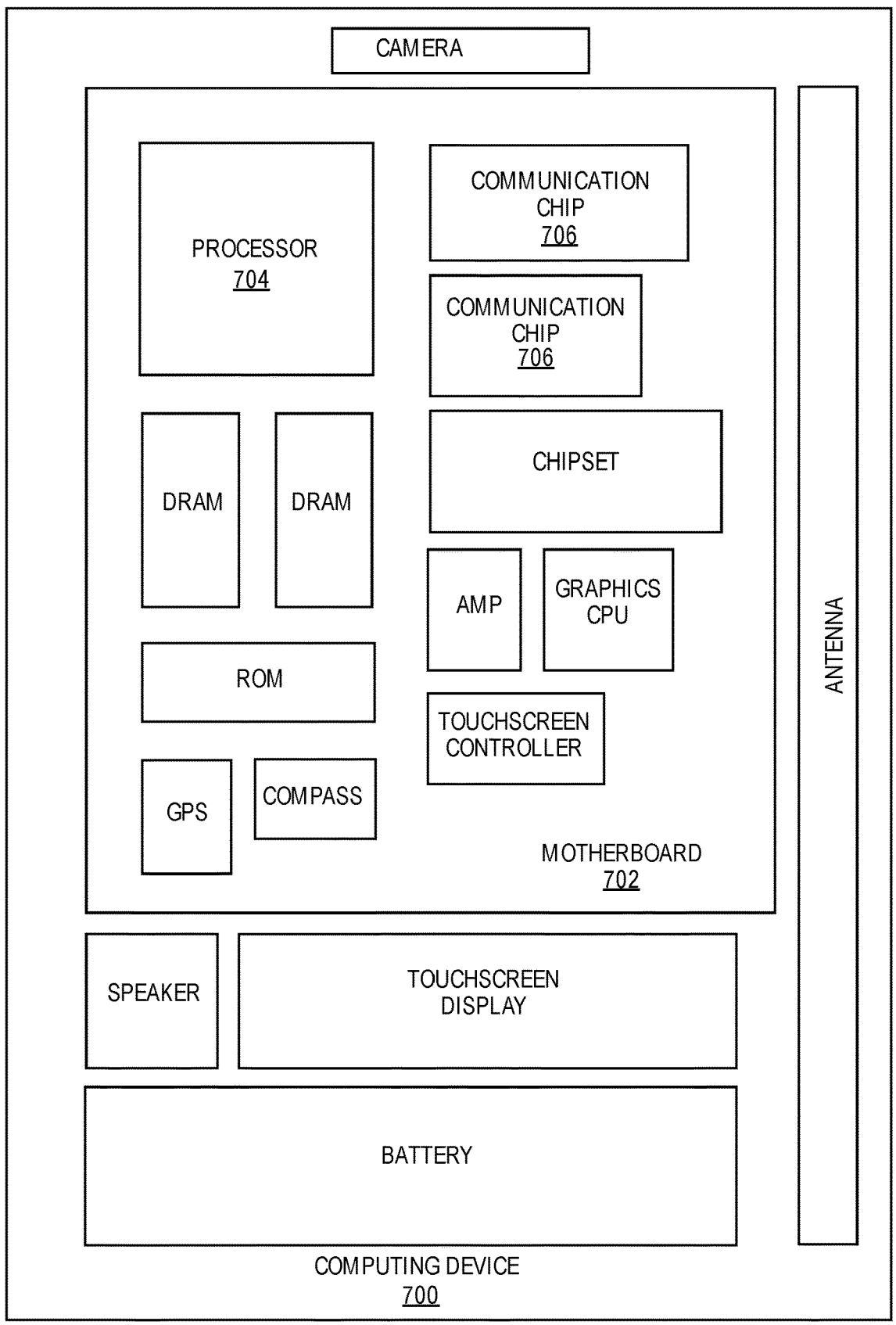
FIG. 7 is a functional block diagram of a group III-N SoC including stack of group III-N transistors of a mobile computing platform, in accordance with an embodiment of the present invention.

FIG. 7 illustrates a computing device in accordance with embodiments of the present invention. FIG. 7 illustrates an example computing device 700 implemented with the integrated circuit structures and/or techniques provided herein, in accordance with some embodiments of the present disclosure. As can be seen, the computing device 700 houses a motherboard 702. The motherboard 702 may include a number of components, including, but not limited to, a processor 704 that includes guard ring structure surrounding transistor structures integrated with silicon CMOS transistors and at least one communication chip 706, each of which can be physically and electrically coupled to the motherboard 702, or otherwise integrated therein. As will be appreciated, the motherboard 702 may be, for example, any printed circuit board, whether a main board, a daughterboard mounted on a main board, or the only board of system 700, etc.

Depending on its applications, computing device 700 may include one or more other components that may or may not be physically and electrically coupled to the motherboard 702. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 700 may include one or more guard ring structure surrounding transistor structures formed using the disclosed techniques in accordance with an example embodiment or guard ring structure surrounding transistor structures integrated with silicon CMOS transistor devices. In some embodiments, multiple functions can be integrated into one or more chips (e.g., for instance, note that the communication chip 706 can be part of or otherwise integrated into the processor 704).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others. In some embodiments, communication chip 706 may be implemented with the techniques and/or structures variously described herein, such that the communication chip 706 includes one or more guard ring structure 100 surrounding transistor structures for example.

The processor 704 of the computing device 700 includes an integrated circuit die packaged within the processor 704. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 706 also may include an integrated circuit die packaged within the communication chip 706. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 704 (e.g., where functionality of any chips 706 is integrated into processor 704, rather than having separate communication chips). Further note that processor 704 may be a chip set having such wireless capability. In short, any number of processor 704 and/or communication chips 706 can be used. Likewise, any one chip or chip set can have multiple functions integrated therein.

In various implementations, the computing device 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Figure 8:
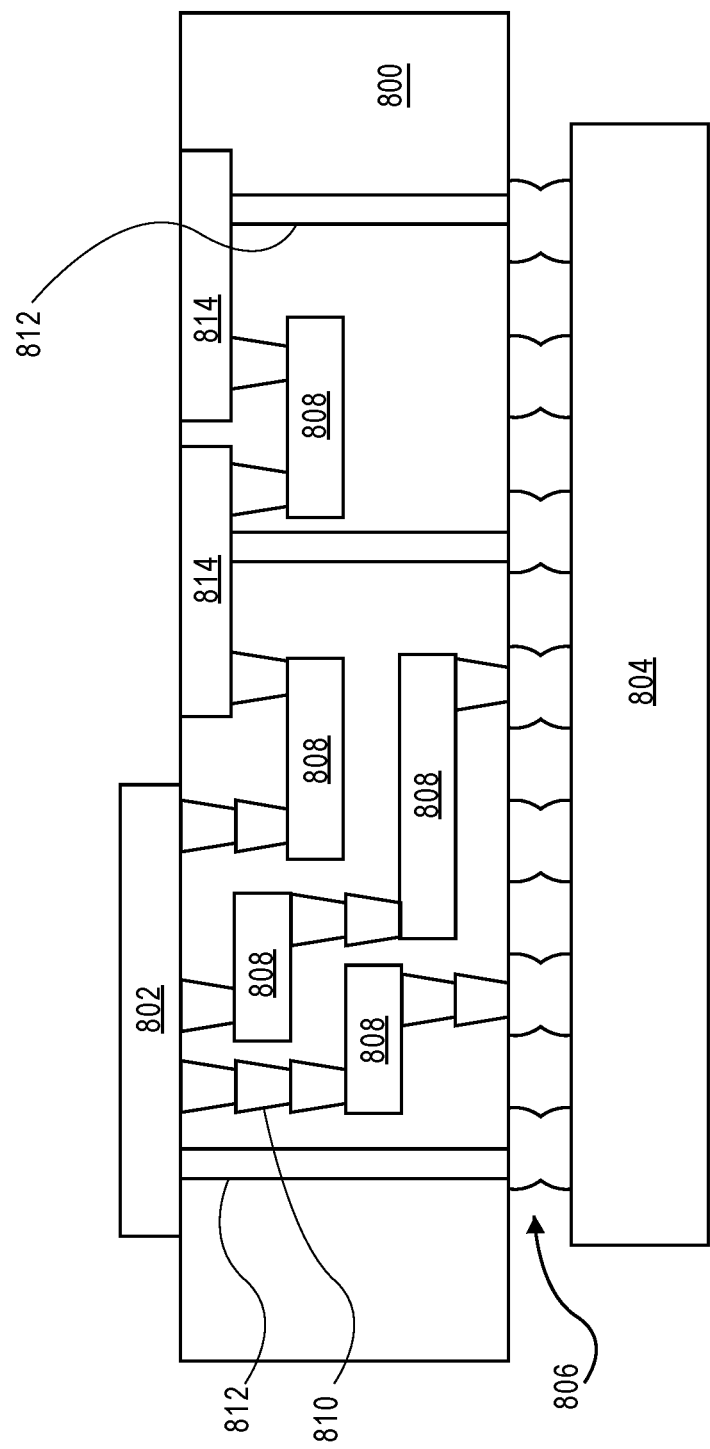
FIG. 8 illustrates an interposer in accordance with embodiments of the present invention.

FIG. 8 illustrates an interposer 800 in accordance with embodiments of the present invention. The interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a module including transistor structures surrounded by a guard ring structure for an RF switch, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 800, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers and sensors. More complex devices such as radio-frequency (RF) devices, RF switch structures surrounded by a plurality of guard ring structures such as a plurality of guard ring structure 100, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

Thus, embodiments of the present invention include guard ring structures and their methods of fabrication.

Example 1

A guard ring includes a semiconductor substrate. A ring of a semiconductor material is disposed on the substrate. The semiconductor material includes a material different from the semiconductor substrate. A conductive ring is disposed on the semiconductor material.

Example 2

The guard ring of example 1, wherein the semiconductor material includes a group III-Nitride semiconductor material.

Example 3

The guard ring of example 1 or 2, wherein the semiconductor material is GaN.

Example 4

The guard ring of example 1 or 2, wherein the semiconductor material of includes an n-type dopant.

Example 5

The guard ring of example 3, wherein the n-type dopant is silicon and doped to a concentration of at least $1e18/cm^3$.

Example 6

The guard ring of example 1, wherein the conductive ring comprises of a plurality of conductive layers.

Example 7

The guard ring of example 1, wherein the semiconductor material has a portion disposed in an opening formed in the substrate.

Example 8

A guard ring structure comprises a substrate. A patterned insulator layer is disposed on the substrate. The patterned insulator layer has a first ring opening and a second ring opening, where the second ring opening is separate from and surrounds the first ring opening. A group III-N semiconductor material is disposed on the substrate in each of the first and the second ring openings. The group III-N semiconductor material disposed in each of the first and in the second ring openings has a pair of sloped sidewalls and an uppermost surface. A contact group III-N semiconductor material is disposed on the uppermost surfaces of the group III-N semiconductor material in each of the first ring opening and in the second ring opening. An interlayer dielectric film is disposed above the patterned insulator layer. The interlayer dielectric film has a portion above the patterned insulator layer, portions adjacent to the sloped sidewalls of the group III-N semiconductor material and portions adjacent to sidewalls of the contact group III-N semiconductor material. A plurality of conductive interconnects is disposed on and coupled to the contact group III-N semiconductor material disposed above the first ring opening and above the second ring opening.

Example 9

The guard ring of example 8, wherein a portion of the sloped sidewall of the group III-N semiconductor material disposed in the first ring opening is in contact with a portion of an adjacent sloped sidewall of the group III-N semiconductor material disposed in the second ring opening.

Example 10

The guard ring of example 8 or 9, wherein the interlayer dielectric film is disposed on a portion of the patterned insulator layer between the sloped sidewall of the group III-N semiconductor material disposed in the first ring opening and the sloped sidewall of the group III-N semiconductor material disposed in the second ring opening.

Example 11

The guard ring of example 8, 9, or 10, wherein the interlayer dielectric film is disposed above the portion of the sloped sidewalls of the group III-N semiconductor material disposed in the first ring opening adjacent to the sloped sidewall of the group III-N semiconductor material disposed in the second ring opening.

Example 12

The guard ring of example 8, 9, 10 or 11, wherein the interlayer dielectric film has a thickness that ranges between 20-80 percent of a thickness of the group III-N semiconductor material disposed in the first ring opening and in the second ring opening.

Example 13

The guard ring of example 8, 10 or 11, wherein the interlayer dielectric film has a thickness that ranges between 40-60 percent of a thickness of the group III-N semiconductor material disposed in the first ring opening and in the second ring opening.

Example 14

The guard ring of example 8, wherein the group III-N semiconductor material has a continuous planar uppermost surface extending from a region above the first ring opening to a region above the second ring opening.

Example 15

The guard ring of example 8, 9, 10, 11, 12, 13 or 14, wherein the group III-N semiconductor material is GaN.

Example 16

The guard ring of example 8, 9, 10, 11, 12, 13, 14 or 15, wherein the group III-N semiconductor material includes an n-type dopant.

Example 17

The guard ring of example 8, 9, 10, 11, 12, 13, 14 or 16, wherein the n-type dopant is silicon and is doped to a concentration of at least $1e18/cm^3$.

Example 18

The guard ring of example 8, wherein the contact group III-N semiconductor material is InGaN.

Example 19

The guard ring of example 8 or 18, wherein the contact group III-N semiconductor material includes an n-type dopant.

Example 20

The guard ring of example 8, 18 or 19, wherein the n-type dopant is silicon and doped to a concentration of at least $1e18/cm^3$.

Example 21

A method of fabricating a guard ring, the method includes providing substrate. The method further includes forming an insulator layer on the substrate. The method includes forming a ring opening in the patterned insulator layer and forming a group III-N semiconductor material in the ring opening. The group III-N semiconductor material has a pair of sloped sidewalls and a planar uppermost surface. The method further includes forming an interlayer dielectric (ILD) on the group III-N semiconductor and on the insulator layer. The method includes forming a contact group III-N semiconductor material on the uppermost surface of the group III-N semiconductor material and forming a conductive interconnect on an uppermost surface of the contact group III-N semiconductor material.

Example 22

The method of example 21, wherein forming the group III-N semiconductor material, includes doping the group III-N semiconductor material with an n-type dopant.

Example 23

The method of example 21, wherein forming the contact group III-N semiconductor material, includes doping the contact group III-N semiconductor material with an n-type dopant.

What is claimed is:
1. A guard ring comprising:
   a semiconductor substrate;
   a ring of a semiconductor material disposed directly on the substrate, the semiconductor material comprising a material different from the semiconductor substrate; and
   a conductive ring disposed on the semiconductor material.
2. The guard ring of claim 1, wherein the semiconductor material includes a group III-Nitride semiconductor material.
3. The guard ring of claim 2, wherein the semiconductor material is GaN.
4. The guard ring of claim 2, wherein the semiconductor material includes an n-type dopant.

5. The guard ring of claim 3, wherein the n-type dopant is silicon and doped to a concentration of at least 1e18/cm$^3$.

6. The guard ring of claim 1, wherein the conductive ring comprises of a plurality of conductive layers.

7. The guard ring of claim 1, wherein the semiconductor material has a portion disposed in an opening in an insulating layer formed on the substrate.

8. A guard ring structure comprising:
a substrate;
a patterned insulator layer disposed on the substrate, the patterned insulator layer having a first ring opening and a second ring opening, the second ring opening separate from and surrounding the first ring opening;
a group III-N semiconductor material disposed on the substrate in each of the first and the second ring openings, the group III-N semiconductor material in each of the first and in the second ring openings having a pair of sloped sidewalls and an uppermost surface;
a contact group III-N semiconductor material disposed on the uppermost surfaces of the group III-N semiconductor material in each of the first ring opening and in the second ring opening;
an interlayer dielectric film disposed above the patterned insulator layer, the interlayer dielectric film having a portion above the patterned insulator layer, portions adjacent to the sloped sidewalls of the group III-N semiconductor material and portions adjacent to sidewalls of the contact group III-N semiconductor material; and
a plurality of conductive interconnects disposed on and coupled to the contact group III-N semiconductor material disposed above the first ring opening and above the second ring opening.

9. The guard ring of claim 8, wherein a portion of the sloped sidewall of the group III-N semiconductor material disposed in the first ring opening is in contact with a portion of an adjacent sloped sidewall of the group III-N semiconductor material disposed in the second ring opening.

10. The guard ring of claim 8, wherein the interlayer dielectric film is disposed on a portion of the patterned insulator layer between the sloped sidewall of the group III-N semiconductor material disposed in the first ring opening and the sloped sidewall of the group III-N semiconductor material disposed in the second ring opening.

11. The guard ring of claim 10, wherein the interlayer dielectric film is disposed above the portion of the sloped sidewalls of the group III-N semiconductor material disposed in the first ring opening adjacent to the sloped sidewall of the group III-N semiconductor material disposed in the second ring opening.

12. The guard ring of claim 11, wherein the interlayer dielectric film has a thickness that ranges between 20-80 percent of a thickness of the group III-N semiconductor material disposed in the first ring opening and in the second ring opening.

13. The guard ring of claim 11, wherein the interlayer dielectric film has a thickness that ranges between 40-60 percent of a thickness of the group III-N semiconductor material disposed in the first ring opening and in the second ring opening.

14. The guard ring of claim 8, wherein the group III-N semiconductor material has a continuous planar uppermost surface extending from a region above the first ring opening to a region above the second ring opening.

15. The guard ring of claim 8, wherein the group III-N semiconductor material is GaN.

16. The guard ring of claim 8, wherein the group III-N semiconductor material includes an n-type dopant.

17. The guard ring of claim 16, wherein the n-type dopant is silicon and is doped to a concentration of at least 1e18/cm$^3$.

18. The guard ring of claim 8, wherein the contact group III-N semiconductor material is InGaN.

19. The guard ring of claim 8, wherein the contact group III-N semiconductor material includes an n-type dopant.

20. The guard ring of claim 19, wherein the n-type dopant is silicon and doped to a concentration of at least 1e18/cm$^3$.

21. A computing device, comprising:
a board; and
a component coupled to the board, the component including a guard ring, comprising:
a semiconductor substrate;
a ring of a semiconductor material disposed directly on the substrate, the semiconductor material comprising a material different from the semiconductor substrate; and
a conductive ring disposed on the semiconductor material.

22. The computing device of claim 21, further comprising:
a memory coupled to the board.

23. The computing device of claim 21, further comprising:
a communication chip coupled to the board.

24. The computing device of claim 21, further comprising:
a camera coupled to the board.

25. The computing device of claim 21, wherein the component is a packaged integrated circuit die.

* * * * *